United States Patent
Ohsaki

(10) Patent No.: US 7,956,987 B2
(45) Date of Patent: Jun. 7, 2011

(54) MEASUREMENT APPARATUS, EXPOSURE APPARATUS, AND DEVICE MANUFACTURING METHOD

(75) Inventor: Yumiko Ohsaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 427 days.

(21) Appl. No.: 12/143,169

(22) Filed: Jun. 20, 2008

(65) Prior Publication Data

US 2008/0316448 A1 Dec. 25, 2008

(30) Foreign Application Priority Data

Jun. 25, 2007 (JP) ................. 2007-166769

(51) Int. Cl.
*G03B 27/72* (2006.01)
*G03B 27/54* (2006.01)

(52) U.S. Cl. .......................................... 355/71; 355/67

(58) Field of Classification Search .................... 355/52, 355/53, 55, 67–71; 356/399–401; 250/548
See application file for complete search history.

(56) References Cited

U.S. PATENT DOCUMENTS

| 7,286,245 B2 * | 10/2007 | Wegmann et al. ............ 356/521 |
| 7,375,799 B2 * | 5/2008 | Van De Kerkhof et al. .... 355/71 |
| 2006/0187435 A1 | 8/2006 | Ohsaki |

FOREIGN PATENT DOCUMENTS

| JP | 02-116732 A | 5/1990 |
| JP | 2002-071515 A | 3/2002 |
| JP | 2004-061515 A | 2/2004 |
| JP | 2004-257854 A | 9/2004 |
| JP | 2005-116732 A | 4/2005 |
| JP | 2006-228930 A | 8/2006 |
| JP | 2006-237617 A | 9/2006 |
| WO | WO 03/028073 A1 | 4/2003 |

* cited by examiner

*Primary Examiner* — Hung Henry Nguyen

(74) *Attorney, Agent, or Firm* — Canon U.S.A, Inc. IP Division

(57) ABSTRACT

A measurement apparatus includes a polarization controller which controls polarization of light, a wavefront dividing unit which divides a wavefront of the light, a polarizing unit which polarizes the light, a detector which detects the light, a first driving unit which moves the wavefront dividing unit with respect to the detector, a second driving unit which moves the polarizing unit with respect to the detector, and a processor which calculates the optical characteristics of the detection target using a detection results obtained when the wavefront dividing unit is positioned in the optical path and a detection result obtained when the wavefront dividing unit is positioned outside the optical path.

9 Claims, 17 Drawing Sheets

FIG. 4

| | MEASURING RETICLE | CONFIGURATION OF WAVEFRONT DIVIDING UNIT |
|---|---|---|
| (a) | PINHOLE | CROSS DIFFRACTION GRATING |
| (b) | PINHOLE | DIFFRACTION GRATING |
| (c) | SLIT | DIFFRACTION GRATING |
| (d) | PINHOLE | TRANSLUCENT REFLECTING SUBSTRATE |

F I G. 15
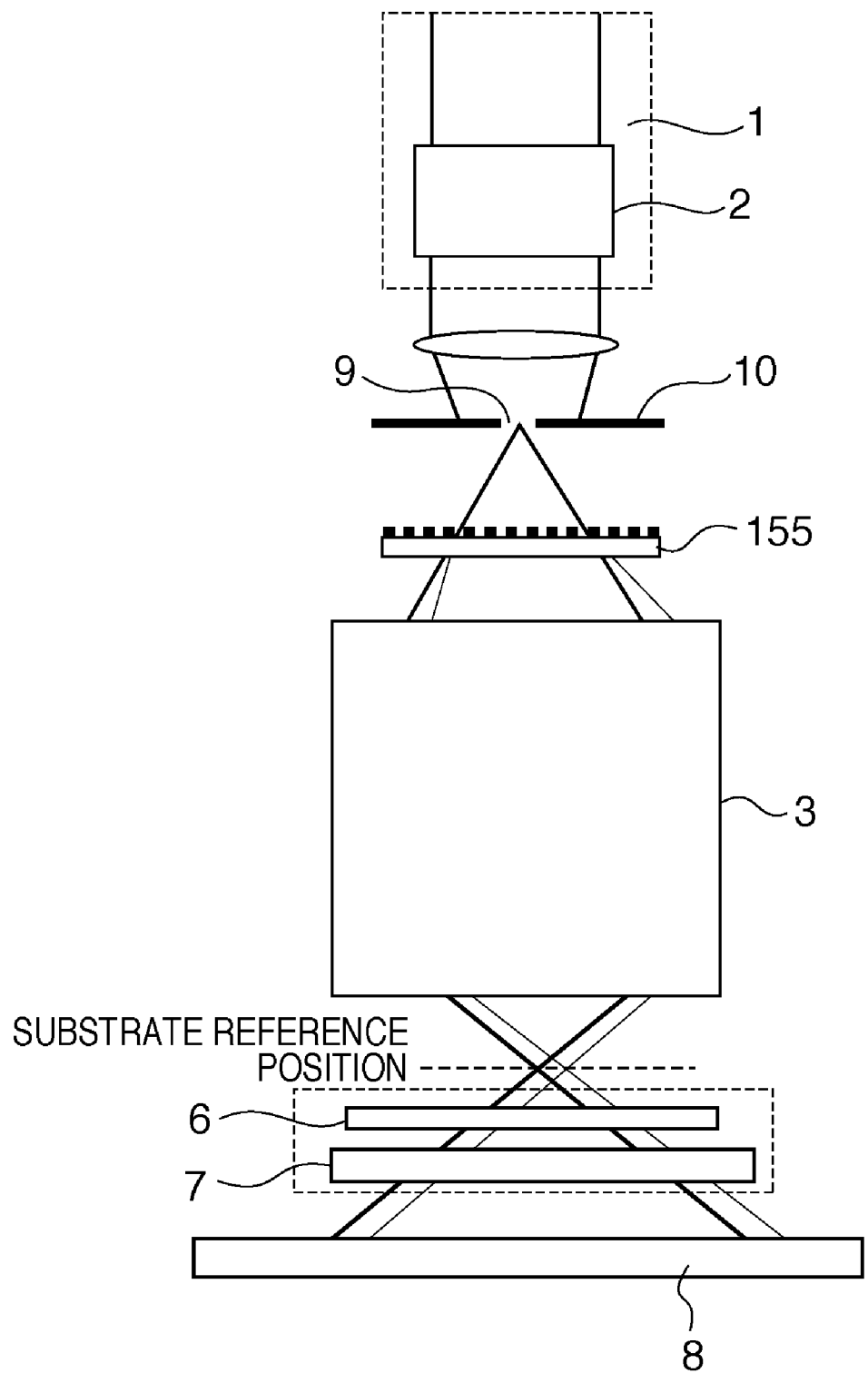

F I G. 18A
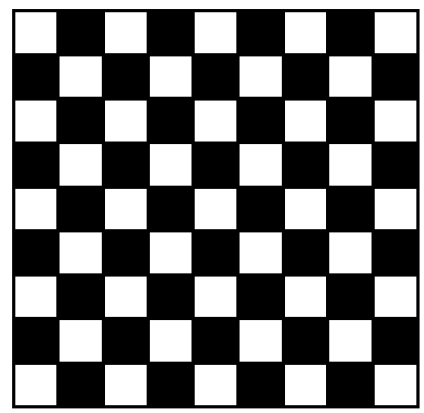
F I G. 18B
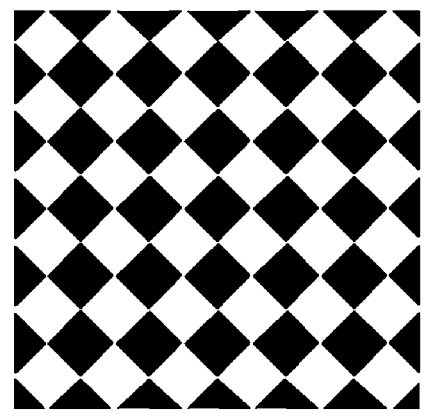
F I G. 18C

F I G. 19
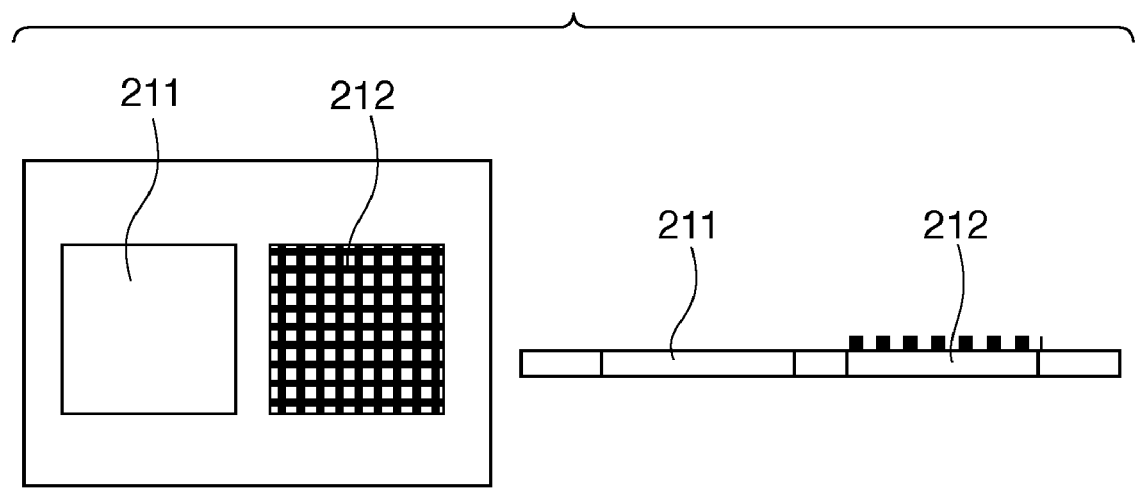

MEASUREMENT APPARATUS, EXPOSURE APPARATUS, AND DEVICE MANUFACTURING METHOD

BACKGROUND OF THE INVENTION

1. Field of the Invention

The present invention relates to a measurement apparatus, exposure apparatus, and device manufacturing method.

2. Description of the Related Art

In the lithography process to manufacture a device such as a semiconductor device, an exposure apparatus is used to transfer the pattern on a reticle (original) onto a wafer (substrate) coated with a resist. Along with the trend toward integrated circuits with a higher density and higher degree of integration, the exposure apparatus must have higher resolution, and accordingly the wavelength of the exposure light is becoming shorter. More specifically, as the light source of the exposure apparatus, use of a KrF excimer laser (wavelength: 248 nm) and an ArF excimer laser (wavelength: 193 nm) has become popular to replace a mercury lamp.

An increase in numerical aperture (NA) of the projection optical system of the exposure apparatus can also increase the resolution. Hence, an immersion exposure apparatus has been proposed in which a liquid with a refractive index larger than 1 fills the space between the projection optical system and a wafer to increase the numerical aperture (NA).

As the resolution of the exposure apparatus increases, strict demands have arisen for measurement and correction of the aberration of the projection optical system of the exposure apparatus. For example, regarding the influences of a slight change in lens position occurring during conveyance of the exposure apparatus and of a change in optical characteristics caused by heat during exposure, they must be grasped accurately and adjusted. For this purpose, after the projection optical system is mounted in the exposure apparatus main body, it is indispensable to measure the optical characteristics of the projection optical system in the exposure apparatus and to adjust them to an optimum state. The optical characteristics do not depend on polarization to be described later but represent the difference in phase from an ideal state, in the same manner as conventional wavefront aberration, and will be described as "unpolarization aberration" hereinafter.

As the numerical aperture (NA) increases, the influence of polarization becomes critical. This leads to the study of a scheme of controlling the polarization of the exposure light. Even when an illumination system controls the exposure light to a desired polarization state, however, distortion of a lens caused by holding the lens or the heat in the lens, use of a birefringent material such as fluorite, reflection of a mirror, and the like may change the polarization state within the projection optical system. Therefore, the necessity to accurately grasp a change in polarization in the projection optical system also increases. As the optical characteristics due to the birefringence of the projection optical system depend on the polarization of an incident beam, they will be described as "polarization aberration" hereinafter. Polarization aberration includes retardation caused by birefringence, and its azimuth. Polarization aberration is expressed in various manners, for example, by the Stokes parameter, Jones matrix, Jones vector, and Mueller matrix, in addition to retardation and azimuth.

In this manner, as the performance of the exposure apparatus improves, demands have arisen to measure unpolarization aberration not dependent on polarization and polarization aberration dependent on polarization quickly and accurately as the optical characteristics of the projection optical system.

As the scheme of measuring the unpolarization aberration and polarization aberration of an optical system, Japanese Patent Laid-Open Nos. 2-116732, 2002-71515, and 2004-257854 propose an interferometer for measurements using interference of a reference wavefront and detection target wavefront. PCT (WO) 2003/028073 proposes use of an aberration measurement unit and a measurement unit which roughly estimates wavefront aberration accompanying birefringence in aberration measurement of a projection optical system. Japanese Patent Laid-Open No. 2005-116732 proposes a method of calculating the Mueller matrix as the polarization information on a projection optical system. Japanese Patent Laid-Open Nos. 2004-61515 and 2006-237617 propose a scheme of measuring the polarization aberration of a projection optical system using an interferometer.

The conventional schemes described above, however, have various problems. The interferometer for measurements disclosed in Japanese Patent Laid-Open Nos. 2-116732, 2002-71515, and 2004-257854 is not appropriate for measurement in the exposure apparatus because its exposure light source has a very short coherent length, in addition to its long, complicated optical path as a non-common path, so that the influence by vibration is non-negligible.

The method disclosed in PCT (WO) 2003/028073 proposes measurement by means of an aberration measurement unit and polarization conversion measurement unit using only two orthogonal linearly polarized beams. With only two orthogonal linearly polarized beams, the retardation and azimuth of birefringence as the polarization aberration of the projection optical system cannot be calculated accurately. According to the method disclosed in PCT (WO) 2003/028073, both the aberration measurement unit and polarization conversion measurement unit respectively have CCDs serving as image sensors. In other words, this method requires two CCDs, which is costly. As the CCDs are inserted in and removed from the exposure apparatus, their positions with respect to the optical axis of the exposure light change. This may hinder accurate measurement.

In addition, the two measurement units must be aligned before measurement. Depending on the alignment accuracy, the correspondence between unpolarization aberration and polarization aberration can change, disabling accurate phase measurement.

Further, lens groups are arranged in the two measurement units, each also requiring optical axis alignment with the optical axis of the measurement apparatus including the projection optical system. Since the effect of an alignment error in the arrangement of the lens group can be extremely big, high accuracy in alignment is required. Therefore, it is necessary to carry out calibration for correcting the alignment error whenever the unit is exchanged, and measurement time is doubled. In addition, this alignment error can leads to deterioration in accuracy, and become a big error-coming factor when highly accurate measurements are asked for.

The method disclosed in Japanese Patent Laid-Open No. 2005-116732 employs a general method of detecting the polarization state of a detection target. According to this method, after being transmitted through a detection target, light passes through a waveplate, polarizer, and image sensor arranged in this order. The waveplate is rotated to detect a change in intensity, thereby detecting the polarization state of the detection target. Although the Mueller matrix is calculated accurately as polarization aberration, this reference discloses nothing concerning measurement of unpolarization aberration.

Japanese Patent Laid-Open Nos. 2004-61515 and 2006-237617 propose a scheme of measuring the polarization aberration of a projection optical system by using an interferometer. These references also disclose a method that employs shearing interference. However, the scheme disclosed in Japanese Patent Laid-Open Nos. 2004-61515 and 2006-237617 does not provide a system that can measure reference polarization aberration in the apparatus. Hence, the system cannot cope with a real-time change of information on the reference polarization aberration, and thus cannot detect polarization aberration information quickly and accurately. Even if the apparatus uses reference polarization aberration information which is measured separately, the information is different from the reference polarization aberration information of the apparatus due to influences such as how the projection optical system incorporated in the exposure apparatus is held, deformation of the projection optical system by its weight, thermal change by exposure, and the like. Therefore, polarization aberration cannot be calculated accurately.

More specifically, with the conventional scheme, unpolarization aberration and polarization aberration (retardation and azimuth of birefringence) which are the optical characteristics of the projection optical system cannot be measured in the exposure apparatus simultaneously, in real time, quickly, and accurately.

In recent years, aberration (exposure aberration), or unpolarization aberration and polarization aberration that change (change over time) in a real time as the optical system generates heat upon exposure, has become a major issue. As micropatterning progresses, the tolerances of unpolarization aberration and polarization aberration decrease, and the required measurement accuracy is becoming stricter and stricter. Therefore, it is very important to measure the unpolarization aberration and polarization aberration of the optical system, with a measurement apparatus being incorporated in the exposure apparatus, quickly (in a real time) and accurately, and to perform real time correction in accordance with the measurement result.

SUMMARY OF THE INVENTION

It is an object of the present invention to provide a measurement apparatus which measures the optical characteristics of an optical system employed in, for example, an exposure apparatus quickly and accurately.

In order to achieve the above object, according to the present invention, there is provided a measurement apparatus for measuring optical characteristics of a detection target, the measurement apparatus comprising: a polarization controller which controls polarization of light which is incident on the detection target; a wavefront dividing unit which divides a wavefront of the light from the polarization controller; a polarizing unit which polarizes the light transmitted through the detection target; a detector which detects the light transmitted through at least one of the wavefront dividing unit and the polarizing unit; a processor which calculates the optical characteristics of the detection target based on a detection result of the detector; and a first driving unit which moves the wavefront dividing unit with respect to the detector to position the wavefront dividing unit in or outside an optical path running from the detection target to the detector, wherein the processor calculates the optical characteristics of the detection target using a detection result obtained when the wavefront dividing unit is positioned in the optical path and a detection result obtained when the wavefront dividing unit is positioned outside the optical path.

The present invention can provide a measurement apparatus which measures the optical characteristics of an optical system employed in, for example, an exposure apparatus quickly and accurately.

Further features of the present invention will become apparent from the following description of exemplary embodiments with reference to the attached drawings.

BRIEF DESCRIPTION OF THE DRAWINGS

FIG. 4 is a table showing arrangement examples of a measuring reticle and detachable wavefront dividing unit;

FIG. 15 is a view showing the schematic arrangement of the exposure apparatus incorporating the measurement apparatus of the fifth embodiment;

FIGS. 18A to 18C are views showing arrangement examples of a two-dimensional diffraction grating; and FIG. 19 is a view showing an arrangement example of a detachable wavefront dividing unit.

DESCRIPTION OF THE EMBODIMENTS

The preferred embodiments of the present invention will be described with reference to the accompanying drawings.

First Embodiment

An exposure apparatus incorporating a measurement apparatus of the first embodiment of the present invention will be described with reference to FIGS. 1 and 2. In the first embodiment, the detection target, the optical characteristics of which are to be measured, is the projection optical system of an exposure apparatus, in which only the wavefront dividing unit is detachable. The measurement apparatus measures "unpolarization aberration" which does not depend on the polarization of illumination light and is the same as conventional wavefront aberration, and retardation and azimuth of birefringence as "polarization aberration" which changes depending on the polarization of the illumination light.

In normal exposure, light provided by an illumination system 1 illuminates an original (exposure reticle) to project the pattern of the original onto a substrate, placed at the substrate reference position, through a projection optical system 3. The substrate reference position is the same as the focal position of the projection optical system 3.

Figure 1:
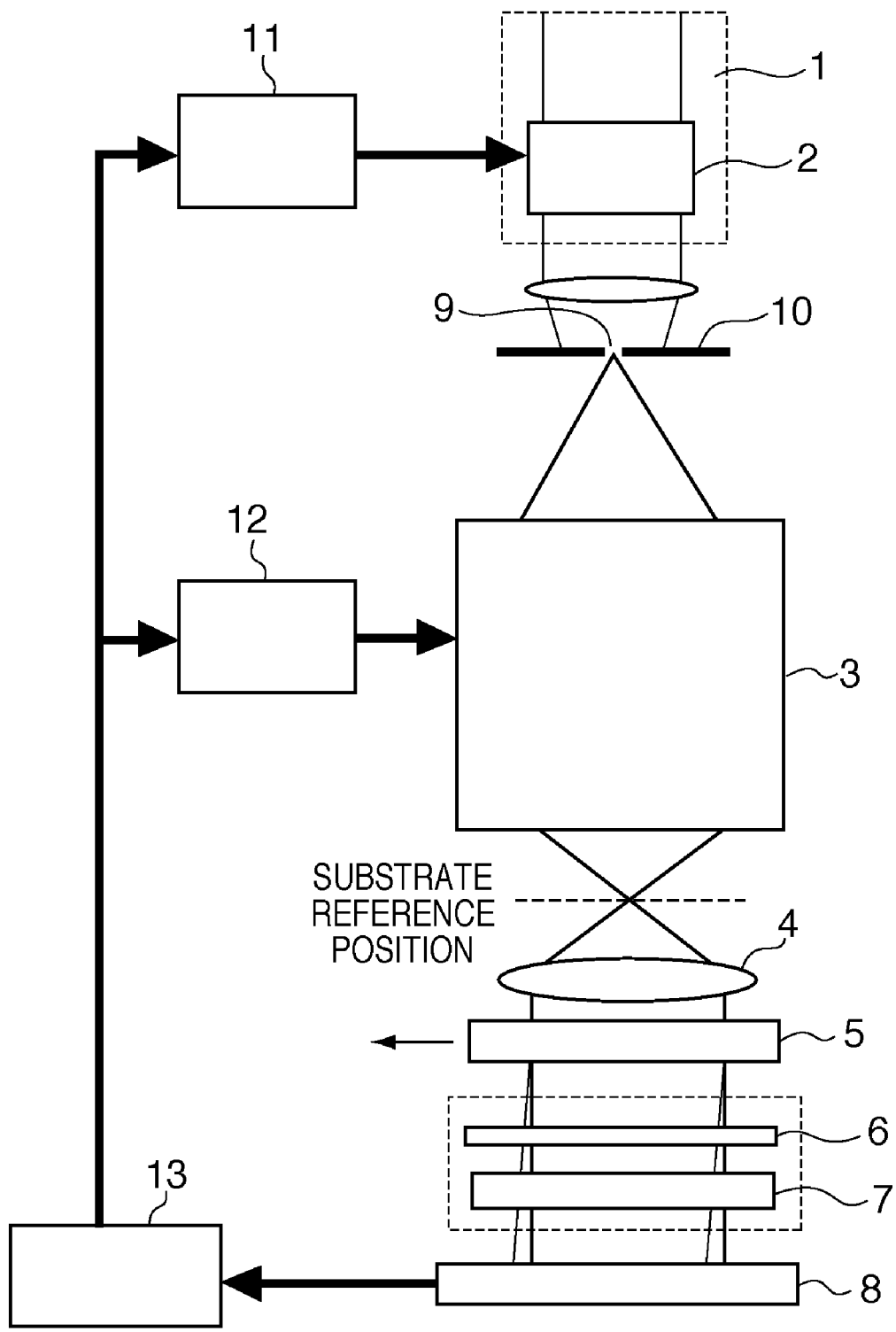
FIG. 1 is a view showing the schematic arrangement of an exposure apparatus incorporating a measurement apparatus of the first embodiment.

In measurement of the optical characteristics of the projection optical system 3, for example, the optical system is arranged as shown in FIG. 1. A polarization controller 2 which controls the polarization of light to irradiate the projection optical system 3 as the detection target is arranged in the illumination system 1 which illuminates the original. In place of the original (exposure reticle), a measuring reticle 10 having a pinhole or slit is arranged. The pinhole or slit removes the aberration of the illumination system 1, so that an ideal wavefront free from aberration can be obtained. A collimator lens 4 transforms a beam transmitted through the projection optical system 3 into parallel light. After the parallel light is transmitted through a wavefront dividing unit 5, waveplate 6, and polarizer 7, a detector 8 such as a CCD detects the light transmitted through the wavefront dividing unit 5, waveplate 6, and polarizer 7. The wavefront dividing unit 5 divides the wavefront of the light transmitted through the projection optical system 3 serving as the detection target. The waveplate 6 and polarizer 7 constitute a polarizing unit which polarizes light transmitted through the projection optical system 3 serving as the detection target. For example, a diffraction grating (primary/secondary), a parallel plate, a translucent reflecting substrate, a plurality of reflecting mirrors, a prism, or the like is arranged as the wavefront dividing unit 5 to constitute a "shearing interferometer" so that the wavefronts divided by the wavefront dividing unit 5 interfere with each other. A processor 13 calculates the optical characteristics of the detection target based on the detection result of the detector 8. The polarization controller 2, measuring reticle 10, collimator lens 4, wavefront dividing unit 5, waveplate 6, polarizer 7, detector 8, and processor 13 constitute a measurement apparatus.

The most important point is that the wavefront dividing unit 5 is detachable so that it can be arranged in or outside the optical path, running from the detection target to the detector 8, in accordance with the measurement conditions. The first driving unit (not shown) moves the wavefront dividing unit 5 with respect to the detector 8. FIG. 1 shows the arrangement of a case in which the wavefront dividing unit 5 is inserted in the optical path, and FIG. 2 shows the arrangement of a case in which the wavefront dividing unit 5 is removed from the optical path. With the arrangement of FIG. 1, measurement using interference can be performed. With the arrangement of FIG. 2, measurement of polarization aberration using intensity change can be performed.

Figure 17:
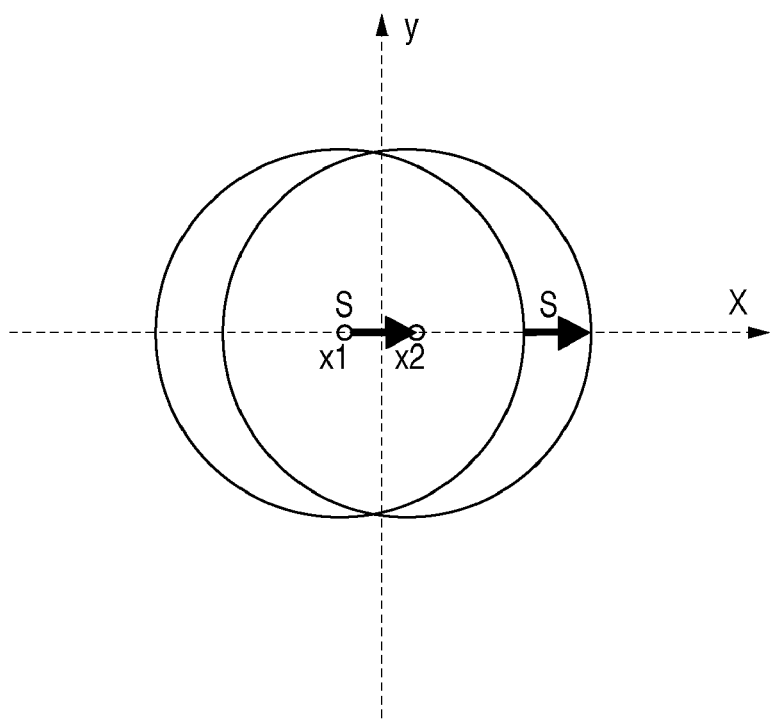
FIG. 17 is a view showing shearing wavefronts.

Measurement using interference with the arrangement of FIG. 1 will be described in more detail. The polarization controller 2 arranged in the illumination system 1 forms measuring incident polarized light. An ideal wavefront obtained as the polarized light is transmitted through a pinhole 9 is transmitted through the projection optical system 3 and changes into a wavefront with aberration information on the projection optical system 3. The wavefront dividing unit 5 divides the wavefront with aberration. Thus, the wavefront dividing unit 5 can constitute a shearing interferometer which causes the wavefronts obtained by division to interfere with each other. A shearing interferometer is an interferometer in which, as shown in FIG. 17, two shifted (sheared) wavefronts are overlaid and interference fringes can be obtained from a difference in optical length between the wavefronts. The number of interference fringes changes in accordance with shear amount (shift amount) S of the wavefronts shown in FIG. 17.

The detector 8 detects the interference fringes obtained by the difference in optical length between the two wavefronts divided by the wavefront dividing unit 5 of FIG. 1. The processor 13 analyzes interference fringe information to obtain a wavefront with aberration (phase) as the differential data of the aberration of the projection optical system 3. As the method of calculating the aberration information on the optical system from interference fringe information, various methods are available, for example, the phase shift method, the FFT method, the electronic moiré method, and the like. Any method can be employed.

By using the arrangement of FIG. 1, the wavefront dividing unit 5 constitutes the shearing interferometer, and phase information can be obtained by analyzing the interference fringes. Note that the phase information obtained from the interference fringes measured by the shearing interferometer represents the differential wavefront (differential phase) of two divided wavefronts.

The light transmitted through the projection optical system 3 forms a wavefront with aberration which is obtained by adding the unpolarization aberration and polarization aberration to the ideal wavefront formed by the pinhole. The shearing interferometer constituted by the wavefront dividing unit 5 detects both the unpolarization aberration and polarization aberration as the differential phase information. The differential wavefront obtained from the shearing interference fringes measured under one certain condition is as shown in equations (1) where W is unpolarization aberration and P is polarization aberration. In actual measurement, interference fringes are measured using a plurality of incident polarized beams formed by the polarization controller 2 of the illumination system 1 under a plurality of conditions obtained by changing the angles of the waveplate 6 and polarizer 7. Based on a plurality of wavefronts with aberration calculated from the plurality of interference fringes, the wavefront with aberration is calculated.

$$\text{Wavefront with aberration of projection optical system} = \text{unpolarization aberration } (W) + \text{polarization aberration } (P)$$

$$\text{Differential wavefront obtained from } X\text{-direction shearing interference fringes} = \text{differential wavefront } (\Delta Wx) \text{ of unpolarization aberration} + \text{differential wavefront } (\Delta Px) \text{ of polarization aberration}$$

$$\text{Differential wavefront obtained from } Y\text{-direction shearing interference fringes} = \text{differential wavefront } (\Delta Wy) \text{ of unpolarization aberration} + \text{differential wavefront } (\Delta Py) \text{ of polarization aberration} \quad (1)$$

where $\Delta Wx = W(x1) - W(x2)$, $\Delta Wy = W(y1) - W(y2)$, $\Delta Px = P(x1) - P(x2)$, $\Delta Py = P(y1) - P(y2)$ The unpolarization aberration W and polarization aberration P are necessary as the aberration of the projection optical system. Thus, the unpolarization aberration W is calculated from the wavefronts with aberration ΔWx and ΔWy of unpolarization aberration obtained from the interference fringes, and the polarization aberration P is calculated from the differential wavefronts ΔPx and ΔPy of polarization aberration in accordance with equations (2). As is apparent from equations (2), the aberration of the projection optical system can be calculated by integrating the wavefronts with aberration.

$$W = \iint \Delta W dx dy + \text{const}(W)$$

$$P = \iint \Delta P dx Dy + \text{const}(P) \quad (2)$$

When calculating unpolarization aberration by integrating differential wavefronts, a constant term const (W) is present, as shown in equation 2, to indicate the shift of the entire wavefront. Regarding unpolarization aberration, the constant term can take any value. When calculating polarization aberration by integration of differential wavefronts, polarization aberration cannot be reconstituted completely without the constant term const (P) shown in equations (2). This is because with only differential wavefronts, information on only displacement of the polarization aberration within the measurement region is available, and the absolute value of the polarization aberration cannot thus be obtained. Therefore, to calculate the retardation and azimuth of birefringence as accurate polarization aberration from the differential wavefronts, data (referred to as "reference birefringence data") on birefringence of at least one point within the measurement region is necessary. The reference birefringence data is calculated by performing polarization measurement using intensity change shown in FIG. 2.

A method of calculating unpolarization aberration and polarization aberration from the differential wavefront obtained by a plurality of measurement operations will be described.

Assume a case in which the polarizing unit (waveplate 6 and polarizer 7) is positioned between the projection optical system 3 and detector 8, as shown in FIG. 1. In this case, a wavefront (measurement wavefront) WP of light detected by the detector 8 is expressed by $$WP = f(L, J, \alpha, \phi, \beta) \quad (3)$$

where L is the incident polarized light, J is the Jones matrix of the projection optical system 3, φ is the phase difference of the waveplate 6, α is the rotation angle of the waveplate, and β is the rotation angle of the polarizer 7.

This is equivalent to the wavefront with aberration of the projection optical system indicated by equations (1), and shows that a wavefront including unpolarization aberration and polarization aberration in mixture is obtained.

As an example of measurement, the optical characteristics of the projection optical system 3 are calculated from measurement results obtained under the following four measurement conditions by employing a λ/2 plate as the waveplate 6 where θ° is the rotation angle, that is, the transmission angle, of the polarizer 7. The four measurement conditions represent a case in which the polarization controller 2 forms two different linearly polarized beams (θ+45° and θ−45°), the polarizer 7 is fixed, and a phase difference plate 62 (λ/2 plate) is rotated through θ° and θ+45°. Wavefronts WP1 to WP4 under the above four measurement conditions are expressed by $$WP1 = f(\theta+45, J, \theta, \lambda/2, \theta)$$

$$WP2 = f(\theta-45, J, \theta, \lambda/2, \theta)$$

$$WP3 = f(\theta+45, J, \theta+45, \lambda/2, \theta)$$

$$WP4 = f(\theta-45, J, \theta+45, \lambda/2, \theta) \quad (4)$$

By employing the four measurement conditions (wavefronts WP1 to WP4) as an example of measurement, the unpolarization aberration and polarization aberration of the projection optical system 3 can be calculated separately. Note that the two incident polarized beams perpendicular to the transmission axis θ of the polarizer are ±45° and are thus different.

A method of separately calculating the unpolarization aberration and polarization aberration of the projection optical system 3 will now be described. To simplify the explanation, first a case will be described in which the polarizing unit (waveplate 6 and polarizer 7) is not arranged and four incident polarized beams are used. As described above, unpolarization aberration does not depend on the polarization state of the entering light, and accordingly it does not change regardless of the polarizing direction of the light. On the other hand, polarization aberration changes in accordance with the polarizing direction of the entering light and the phase difference and rotation angle of the waveplate 6. Hence, wavefronts (measured wavefronts) measured from the four incident polarized beams are expressed by 0° polarized light wavefront=unpolarization aberration+polarization aberration (0°)

90° polarized light wavefront=unpolarization aberration+polarization aberration (90°)

45° polarized light wavefront=unpolarization aberration+polarization aberration (45°)

−45° polarized light wavefront=unpolarization aberration+polarization aberration (−45°) (5)

The advance phase axis and retardation axis are perpendicular to the azimuth of birefringence which is polarization aberration. Therefore, when the advance phase axis is in the 0° direction, the retardation axis is in the 90° direction. Similarly, when the advance phase axis is in the 45° direction, the retardation axis is in the −45° direction.

For example, assume that the advance phase axis of birefringence of the projection optical system 3 is in the 0° direction. When 0°-direction linearly polarized light enters the projection optical system 3, as the advance phase axis of birefringence coincides with the incident polarized light, the wavefront as a whole advances from unpolarization aberration by a retardation amount. When 90°-direction linearly polarized light enters the projection optical system 3, as the retardation axis of birefringence coincides with the incident polarized light, the wavefront as a whole delays from unpolarization aberration by the retardation amount. Assuming that advance of the wavefront is expressed as + and that the delay of the wavefront is expressed as −, the signs of the polarized light wavefronts are inverted, as expressed by the equations (6). Note that 45° incident polarized light and −45° incident polarized light are estimated to establish a similar relationship.

unpolarization aberration (0°)=−polarization aberration (90°)

polarization aberration (45°)=−polarization aberration (−45°) (6)

Therefore, equations (5) can be rewritten as equations (7):

0° incident wavefront=unpolarization aberration+polarization aberration (0°)

90° incident wavefront=unpolarization aberration−
polarization aberration (0°)

45° incident wavefront=unpolarization aberration+
polarization aberration (45°)

−45° incident wavefront=unpolarization aberration−
polarization aberration (45°)  (7)

Referring to equations (7), the unpolarization aberration and polarization aberration of the projection optical system 3 can be separated as expressed by unpolarization aberration=(0° incident wavefront+90° incident wavefront)/2

=(45° incident wavefront+(−45° incident wavefront))/2

=(0° incident wavefront+90° incident wavefront+45° incident wavefront+(−45° incident wavefront)/4)
polarization aberration (0°)

=(0° incident wavefront−90° incident wavefront)/2
polarization aberration (45°)

=(45° incident wavefront−(−45° incident wavefront))/2  (8)

In this manner, when the wavefronts are measured using four types of linearly polarized beams, that is, 0° linearly polarized light, 90° linearly polarized light, 45° linearly polarized light, and −45° linearly polarized light, the unpolarization aberration and polarization aberration of the projection optical system 3 can be calculated separately (see equations (8)). Although a case has been described which uses four incident polarized beams, the −45° incident wavefront can be calculated from three wavefronts, that is, 0° incident wavefront, 90° incident wavefront, and 45° incident wavefront, as is apparent from equations (8) as well. Therefore, the unpolarization aberration and polarization aberration of the projection optical system 3 can be calculated separately by measuring the wavefronts using three incident polarized beams, that is, 0° linearly polarized light, 90° linearly polarized light, and 45° linearly polarized light. Polarization aberration includes two variables, that is, retardation and advance phase axis. Accordingly, polarization aberration (0°) and polarization aberration (45°) are necessary.

The correspondence between wavefronts measured by changing the incident polarized light without arranging the polarizing unit (waveplate 6 and polarizer 7) and the wavefronts WP1 to WP4 measured by arranging the polarizing unit (waveplate 6 and polarizer 7) with the transmission axis $\theta$ of the polarizer being 0° is expressed by 0° incident wavefront=$WP1+WP2$ 90° incident wavefront=$WP3+WP4$ 45° incident wavefront=$WP1+WP3$ −45° incident wavefront=$WP2+WP4$  (9)

Therefore, unpolarization aberration, polarization aberration (0°), and polarization aberration (45°) can be calculated as expressed by unpolarization aberration=$((WP1+WP2)+(WP3+WP4))/2$ polarization aberration (0°)=$((WP1+WP2)−(WP3+WP4))/2$ polarization aberration (45°)=$((WP1+WP3)−(WP2+WP4))/2$  (10)

Therefore, even when the polarizing unit (waveplate 6 and polarizer 7) exists, if interference measurement is performed under at least the four conditions, the unpolarization aberration and polarization aberration of the projection optical system 3 can be calculated separately.

As an example of the measurement method using interference, the above description exhibits that measurement can be performed with the three conditions when the polarizing unit does not exist, and with the four conditions when the polarizing unit exists. Naturally, as the measurement conditions increase, the information quantity increases, leading to high accuracy.

The above conditions are merely examples. Even when a $\lambda/4$ plate or a phase plate having a phase difference other than $\lambda/4$ is used as the waveplate, or even when the polarizer does not rotate but is stationary, measurement is possible based on the same concept. Hence, other than the measurement conditions described hereinabove, very many conditions are available that enable measurement.

Furthermore, a case of calculating the reference birefringence data by performing polarization measurement using intensity change with the arrangement of FIG. 2 will now be described. To measure the reference birefringence data, the detachable wavefront dividing unit 5 is removed from the optical path, as shown in FIG. 2. By removing the wavefront dividing unit 5 from the optical path, the optical path of the light upon passing through the projection optical system 3 is constituted by the collimator lens 4, waveplate 6, and polarizer 7 to form an apparatus that performs polarization measurement of the projection optical system 3 using the intensity. When performing polarization measurement using intensity change, the polarization controller 2 in the illumination system 1 forms incident linearly polarized light for measurement. The incident linearly polarized light is transmitted through the projection optical system 3 to undergo elliptic polarization by the polarization aberration of the projection optical system 3. The waveplate 6 is rotatable. The waveplate 6 is rotatable. The waveplate 6 is rotated at least three times, and the detector 8 detects a change in intensity distribution of light transmitted through the polarizer 7 at each waveplate angle. Obviously, if the number of rotations of the polarizer is increased to be more than 3 and the number of times of measurement operation is increased, measurement can be performed more accurately. In this manner, by analyzing the polarization state of the elliptic polarization after transmission through the projection optical system 3 using rotation of the waveplate 6 and the polarizer 7, the polarization aberration of the projection optical system 3 can be obtained.

The measuring reticle 10 where the pinhole is arranged may be removed from the optical path in synchronism with the timing when the detachable wavefront dividing unit 5 is removed from the optical path. Alternatively, the measuring reticle 10 may be changed to one having a larger pinhole diameter. Since the apparatus that performs polarization measurement by using intensity change can measure only polarization aberration without being influenced by unpolarization aberration. Accordingly, the wavefront aberration of the illumination light need not be removed. Therefore, the light quantity can be increased by removing the measuring reticle 10 from the optical path or by using a reticle with a larger pinhole diameter, thus increasing the detection accuracy.

To calculate polarization aberration accurately by performing polarization measurement using intensity change, it is preferable to take devices such as controlling the measurement light accurately to remove the influence of the polarization aberration of the illumination system, or measuring the polarization aberration of the illumination system separately to separate the polarization aberration from the optical characteristics of the projection optical system.

The scheme of analyzing the polarization aberration and the elliptic polarization state by using the waveplate 6, polarizer 7, and detector 8 and detecting the light intensity change is available in various methods, for example, as the method of rotating the polarizer 7 as well, the method of performing measurement using a plurality of incident linearly polarized beams, and the like in addition to the calculation method by rotation of the waveplate 6. An optimum method may be selected in accordance with the target to be measured, the accuracy, and conditions on the arrangement of the apparatus.

As described above, polarization measurement using intensity change suffices if reference birefringence data of at least one point within the measurement region can be calculated. Alternatively, data on a plurality of points within the measurement region may be calculated.

By measuring intensity change of the entire measurement region, the polarization aberration information of the entire surface of the pupil can also be measured.

As described above, according to this embodiment, the detachable wavefront dividing unit 5 and the waveplate 6 and polarizer 7 which serve as the polarizing unit are arranged between the projection optical system 3 and detector 8, that is, on the substrate side. When the wavefront dividing unit 5 is arranged in the optical path, the measurement apparatus constitutes a shearing interferometer which measures interference fringes. When the wavefront dividing unit 5 is arranged outside the optical path, the measurement apparatus constitutes an apparatus for measuring polarization using intensity change, which measures a change in light intensity distribution occurring when rotating the waveplate 6. The processor 13 calculates the unpolarization aberration and polarization aberration (the retardation and azimuth of birefringence) of the detection target by using the differential wavefront data on the unpolarization aberration and polarization aberration obtained from interference fringes on the interferometer side and the reference birefringence data of at least one point within the measurement region which is detected by polarization measurement using intensity change.

In this manner, since measurement using interference and polarization measurement using intensity change can be realized by only driving the detachable wavefront dividing unit 5, the resultant apparatus has a very simple arrangement, is free from errors, and can calculate the optical characteristics of the projection optical system 3 accurately.

The most important point is that since the detachable wavefront dividing unit is not sensitive to the position accuracy in the detaching direction (perpendicular to the optical axis), an error caused by detaching is very small.

When attaching/detaching a whole unit including an optical system and the like, very high alignment accuracy is required for alignment with the optical axis of the optical system. An error in alignment leads to degradation of the accuracy. In this embodiment, however, since the detachable wavefront dividing unit is not sensitive to the position accuracy in the attaching/detaching direction, the alignment accuracy can be very low, and accurate measurement becomes possible. The same applies to a case of attaching/detaching the polarizing unit (waveplate 6 and polarizer 7). The alignment accuracy in the detaching direction can be very low, and accurate measurement is possible.

If phase shift is to be performed, an optical element arranged at the wavefront dividing unit must be changed from the initial position with a pitch equal to or smaller than the wavelength by using a piezoelectric element or the like. In this case as well, the factor that influences the accuracy is control of the piezoelectric element, and the alignment accuracy of the initial position can be very low.

To measure the aberration of the projection optical system 3 more accurately, the aberration (system aberration) of the collimator lens 4 need be separated.

To measure the system aberration, for example, a pinhole is arranged at the reference position of the substrate to remove the aberration information of the projection optical system 3, and measurement using interference and polarization measurement using intensity change are performed in the same manner as described above. More specifically, assume a case in which the pinhole is formed at the original (reticle) position and a case in which the pinhole is formed at the substrate position. In both cases, the wavefront dividing unit 5 is inserted in the optical path, and interference is measured. Also, the wavefront dividing unit 5 is removed from the optical path, and polarization characteristics using intensity change are measured. The system aberration measured with the arrangement in which the pinhole is formed at the substrate position is subtracted from the aberration measured with the arrangement in which the pinhole is formed at the original (reticle) position, so that the aberration of the projection optical system 3 can be grasped accurately.

Furthermore, according to this embodiment, a control unit 11 for the illumination system 1 controls and adjusts the illumination system 1 based on the information on the unpolarized light wavefront and polarized light wavefront calculated by the processor 13. A control unit 12 for the projection optical system 3 controls and adjusts the projection optical system 3. As the unpolarization aberration depends on the lens shapes and surface gap, for example, the control unit 12 for the projection optical system adjusts the gaps or the like of the lenses that constitutes the projection optical system 3 based on the measured unpolarization aberration information. Based on the measured polarization aberration, the control unit 12 for the projection optical system adjusts the lenses by, for example, changing how the lenses are held or deforming the lenses, to decrease the polarization aberration. Alternatively, considering the measured polarization aberration of the projection optical system 3, the control unit 11 for the illumination system performs adjustment by, for example, controlling the planar polarization state in the illumination system 1, changing the illumination distribution, or the like, so that the illumination light propagates onto the substrate surface in an optimum state.

It is desirable that the unpolarization aberration and polarization aberration are finally the smallest on the substrate surface. For this purpose, the aberration measurement of the projection optical system 3 and the optimum control of the projection optical system 3 and illumination system 1 may be repeated a plurality of number of times, for example, measurement→adjustment→measurement→adjustment, so that the unpolarization aberration and polarization aberration become the smallest.

In this manner, by inserting and removing the detachable wavefront dividing unit 5 in and from the optical path, measurement using interference and polarization measurement using intensity change can be performed with one apparatus, so that the optical characteristics of the projection optical system 3 can be calculated accurately. Note that measurements using interference and polarization measurement using intensity change need not always be performed alternately. For example, polarization measurement using intensity may be performed first, and after that measurement using interference may be repeated a plurality of number of times. Alternatively, polarization measurement using intensity change may be performed at the start and end of the day, and adjustment may be done with measurement using interference. In this manner, the timings of two measurement operations can be selected in accordance with necessary accuracy, apparatus arrangement, a difference in aberration sensitivity, and the like. The most important point is to perform measurement using interference and polarization measurement using intensity change with one apparatus, and calculate the optical characteristics of the projection optical system 3 using the two pieces of data.

Furthermore, by employing this embodiment, only unpolarization aberration can be measured by means of measurement using interference, and polarization aberration can be measured by means of polarization measurement using intensity change.

To measure only unpolarization aberration using interference, the arrangement of FIG. 1 in which the detachable wavefront dividing unit 5 is inserted in the optical path must be used, and measurement must be performed under such conditions that the polarization aberration of the optical system as the detection target which is changed by polarization does not influence the measurement. More specifically, the measurement conditions must be selected with which $\Delta Px$ and $\Delta Py$ indicated in equations (1) can be excluded so that only $\Delta Wx$ and $\Delta Wy$ can be obtained.

Such conditions can be achieved by performing measurement by employing random polarized light as the incident polarized light or by arranging a polarizing unit on the light-receiving side under desired conditions and performing measurement by using circularly polarized light. These conditions can render $\Delta Px$ and $\Delta Py$ to zero.

Alternatively, the above conditions can also be achieved by arranging the polarizing unit on the light-receiving side under desired conditions and performing measurement using two orthogonal incident polarized beams (e.g., X polarized light and Y polarized light, or a right circle (clockwise circularly polarized light) and left circle (counterclockwise circularly polarized light)). In this case, $\Delta Px$ and $\Delta Py$ in equations (1) have the same absolute value and are different only in sign. Therefore, the influence of polarization aberration can be excluded by performing measurement using interference with two orthogonal incident polarized beams and calculating the average of the obtained wavefronts.

Figure 2:
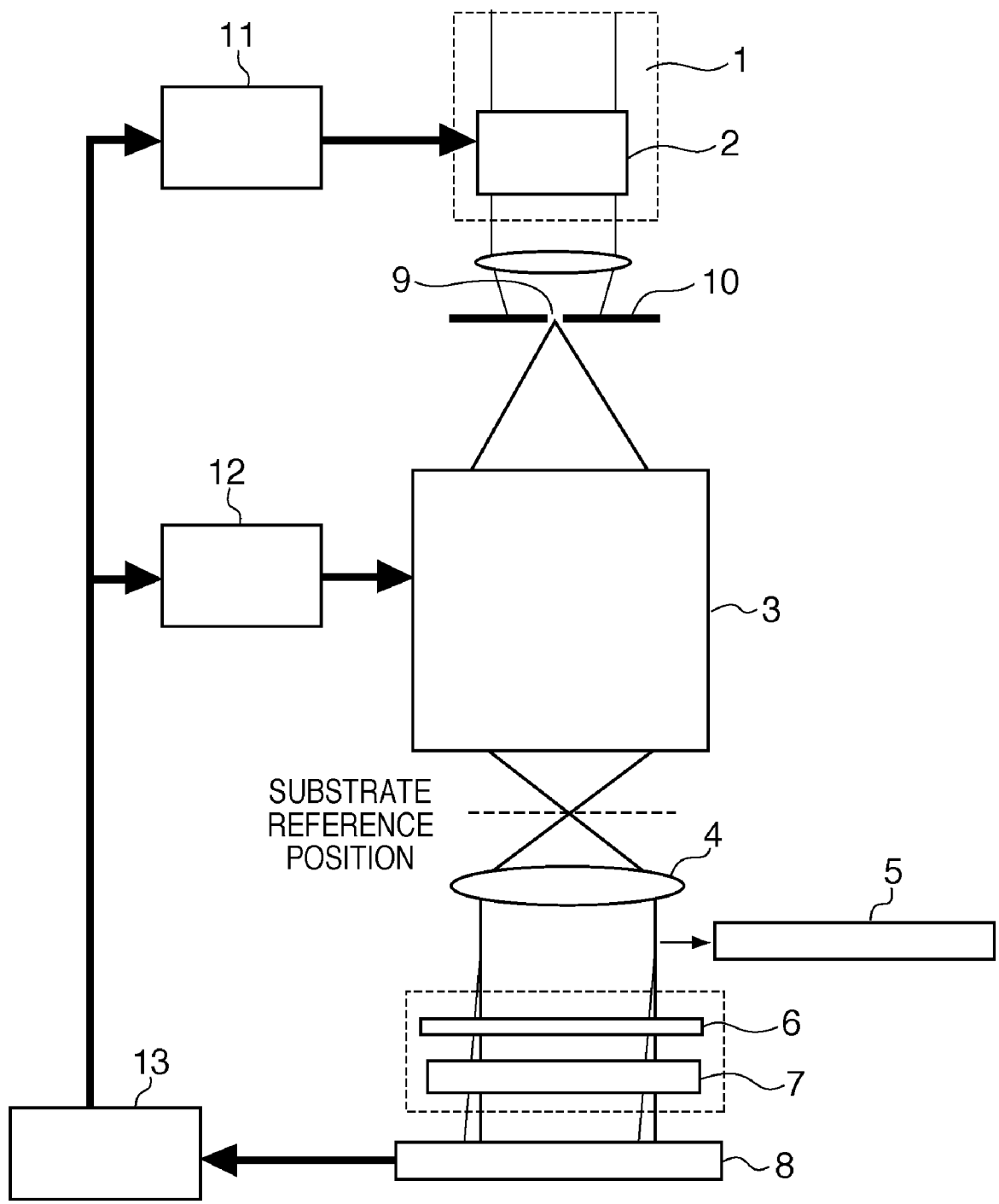
FIG. 2 is a view showing the schematic arrangement, in polarization measurement using intensity change, of an exposure apparatus incorporating a measurement apparatus of the first or fourth embodiment.

To perform polarization aberration measurement using intensity change, the detachable wavefront dividing unit 5 is removed from the optical path, and polarization aberration measurement using intensity change is performed with the arrangement shown in FIG. 2. As described above, the polarization characteristics of the optical system can be measured by employing a scheme such as rotating the waveplate 6 at least three times. If only information on unpolarization aberration can be obtained by interference measurement, polarization aberration information on the entire surface must be obtained.

In this manner, the characteristic feature of this embodiment resides in that measurement using interference and measurement using intensity change are compatible by inserting and removing the detachable wavefront dividing unit 5 in and from the optical path. By using the two types of measurement operations, the unpolarization aberration and polarization aberration of the optical system can be calculated easily and accurately.

Polarization aberration is not limited to the retardation and azimuth of birefringence. Naturally, the Stokes parameter, Jones matrix, Jones vector, Mueller matrix, or the like may be calculated.

A measurement sensor which measures the polarization state may be arranged in order to check whether or not the polarized light to enter the projection optical system 3 is in the target polarization state. By comprising such a measurement sensor, the polarization state of the polarized light to enter the projection optical system 3 can be checked, thus enabling more accurate measurement. Such a measurement sensor can be formed to include the illumination light measuring reticle 10, as shown in, for example, FIG. 11. Generally, the reticle 10 has a thickness of about 6 mm, and a pellicle is present at a position about 6 mm under the lower surface of the measuring reticle 10, providing a total thickness of about 12 mm. If the lens and mirror are arranged to be contained within the range of 12 mm, the polarization state of the light entering the projection optical system 3 can be measured at a position on the reticle side without moving the projection optical system 3. The lens transforms the illumination light into parallel light, and the combination of the mirror, the waveplate 6, the polarizer 7, and the detector 8 performs measurement. The positions of the lens and mirror are not limited to those shown in FIG. 11, and the lens may come after the mirror. In place of the polarizer 7, a mirror or polarizing beam splitter arranged at a Brewster angle may be used. An alignment scope may be employed for receiving light. If the illumination light measuring reticle is used, the polarization aberration (birefringence amount and azimuth) of the illumination system can also be measured. By measuring the polarization aberration of the illumination system in this manner, the optical characteristics of the projection optical system can be calculated accurately.

Figure 11:
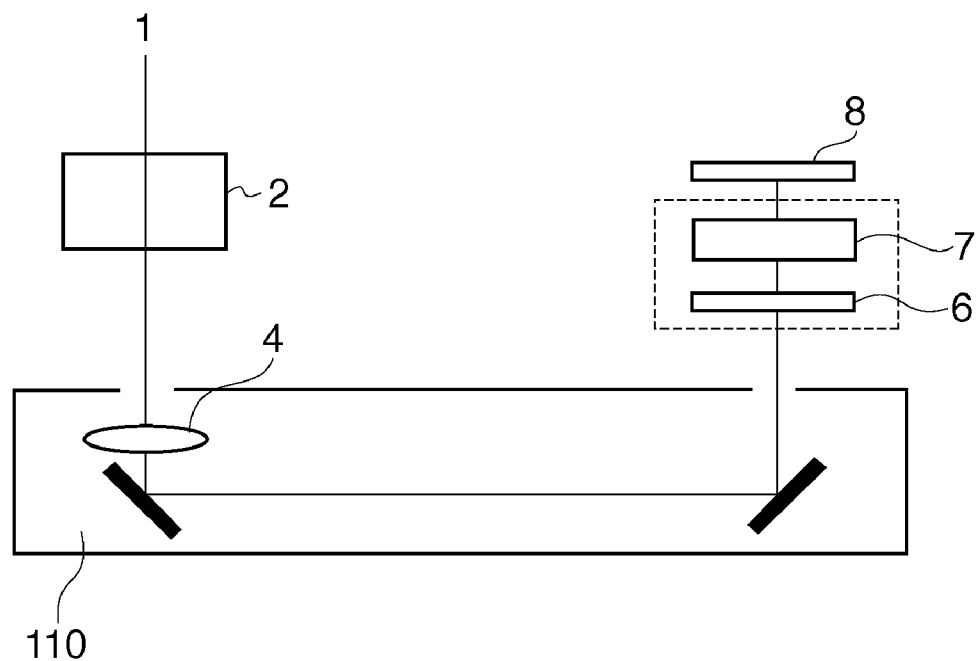
FIG. 11 is a view showing an example of a measurement sensor which measures the polarization of illumination light.

Not only the projection optical system 3 may be measured to optimize the projection optical system 3 or illumination system 1, but also a system that measures the optical characteristics of the illumination system 1 may be separately provided, as shown in FIG. 11, to optimize both the projection optical system 3 and illumination system 1, as a matter of course. Also, naturally, the polarization aberration of the entire surface of the measurement region may be calculated with the same arrangement as that of this embodiment, by inserting a wavefront dividing unit in the optical path, measuring unpolarization aberration by interference measurement, removing the wavefront dividing unit from the optical path, and performing polarization measurement using intensity change.

The wavefront dividing unit may have, for example, an arrangement as shown in FIG. 19. Reference numeral 211 denotes a parallel plate, and 212, a diffraction grating to serve as a wavefront dividing unit. The wavefront dividing unit 212 may be arranged in the optical path to perform measurement using interference. Then, in place of the wavefront dividing unit, the parallel plate 211 may be arranged in the optical path to transmit light through it, so that polarization aberration may be measured. In particular, when adopting a wavefront dividing unit for divergent light and convergent light, an adverse effect such as fluctuation in focal position or spherical aberration occurs depending on the material and thickness of the substrate of the diffraction grating. In place of the diffraction grating serving as the wavefront dividing unit, if a parallel plate having the same material and material as those of the diffraction grating is inserted in the optical path, this adverse effect can be decreased. It is preferable to add an anti-reflection film to the parallel plate in order to prevent light reflection. If the adverse effect stays within an allowable range, the parallel plate 211 need not be arranged, and the window may be left open.

As described above, in the first embodiment of the present invention, a case has been described in which the detachable wavefront dividing unit 5 is provided on the substrate side in order to calculate the unpolarization aberration and polarization aberration of the projection optical system 3, and both measurements using interference and polarization measurement using intensity change are employed. However, one characteristic feature of this embodiment resides in a system in which the wavefront dividing unit 5 is detachable so that both measurements using interference and polarization measurement using intensity change can be employed. The arrangement of the wavefront dividing unit 5, the positions of other optical systems, and the like are not limited to those shown in the drawings. This embodiment can be applied to various types of arrangements to obtain the same effect.

The characteristic feature of this embodiment resides in that measurement using interference and measurement using intensity can be performed easily and accurately by detaching the wavefront dividing unit. Measurement using intensity includes not only polarization measurement described above but also measurement of transmittance distribution and illumination light. Therefore, for example, it is also possible to measure the unpolarization aberration of the optical system by measurement using interference and measure the transmittance distribution of the optical system by measurement using intensity.

Second Embodiment

An exposure apparatus incorporating a measurement apparatus of the second embodiment of the present invention will be described. The measurement apparatus of the second embodiment serves to measure the optical characteristics of a projection optical system 3 and comprises a diffraction grating 55 serving as a detachable wavefront dividing unit. The diffraction grating 55 can be inserted in and removed from the optical path. The most characteristic feature of this embodiment resides in the following respect. More specifically, when the diffraction grating 55 is in the optical path, the apparatus can perform measurement using interference. When the diffraction grating is not in the optical path, the apparatus can perform polarization measurement using intensity change.

First, the diffraction grating 55 is inserted in the optical path, and interference measurement is performed. Incident polarized light formed by a polarization controller 2 arranged in an illumination system 1 forms an ideal wavefront as it is transmitted through, for example, a pinhole 9 formed in a measuring reticle 10. When the ideal wavefront is transmitted through the projection optical system 3, it forms a wavefront having unpolarization aberration and polarization aberration. The diffraction grating 55 inserted in the optical path divides the wavefront, and the divided wavefronts are transmitted through a waveplate 6 and polarizer 7 arranged at desired rotation angles. A detector 8 measures interference fringes formed by overlaid wavefronts. A plurality of interference fringes are measured depending on the combinations of incident polarized light and the angles of the waveplate 6 and polarizer 7, and the differential wavefronts of unpolarization aberration and polarization aberration are calculated.

Subsequently, the diffraction grating 55 is removed from the optical path, and polarization measurement using intensity change is performed. Desired incident polarized light is formed, and the waveplate 6 is rotated a plurality of number of times to measure intensity change. From this measurement, polarization aberration information on at least one point within the measurement region is calculated, and is determined as reference birefringence information. Unpolarization aberration and polarization aberration as the optical characteristics of the projection optical system 3 can be calculated by the differential wavefront obtained from measurement using interference and reference birefringence data obtained by polarization measurement using intensity change.

Regarding the positional relationship between the diffraction grating 55 arranged as the detachable wavefront dividing unit and the detector 8, for example, the diffraction grating 55 and detector 8 may be arranged to satisfy the Talbot condition indicated in equation (11), or within the range of a distance falling within half the range of the Talbot distance as indicated in equation (12). Equation (12) includes predetermined interference fringes, and their inverted interference fringes.

$$Z = mp^2/\lambda \quad (11)$$

where Z is the distance between the diffraction grating and detector, p is the pitch of the diffraction grating, λ is the wavelength, and m is an integer.

$$mp^2/\lambda - p^2/4\lambda \leq Z \leq mp^2/\lambda + p^2/4\lambda \quad (12)$$

where Z is the distance between the diffraction grating and detector, p is the pitch of the diffraction grating, λ is the wavelength, and m is an integer.

Figure 5:
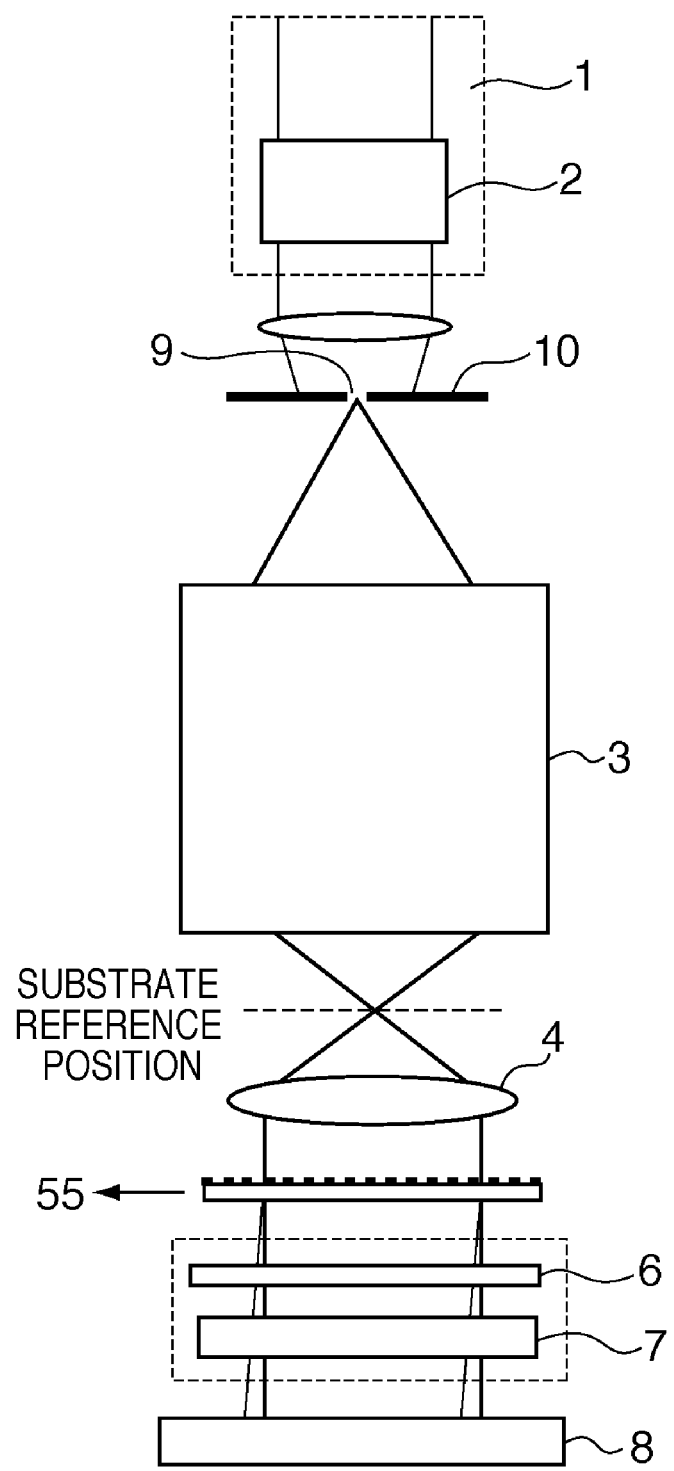
FIG. 5 is a view showing the schematic arrangement of an exposure apparatus incorporating a measurement apparatus of the second embodiment.
Figure 6:
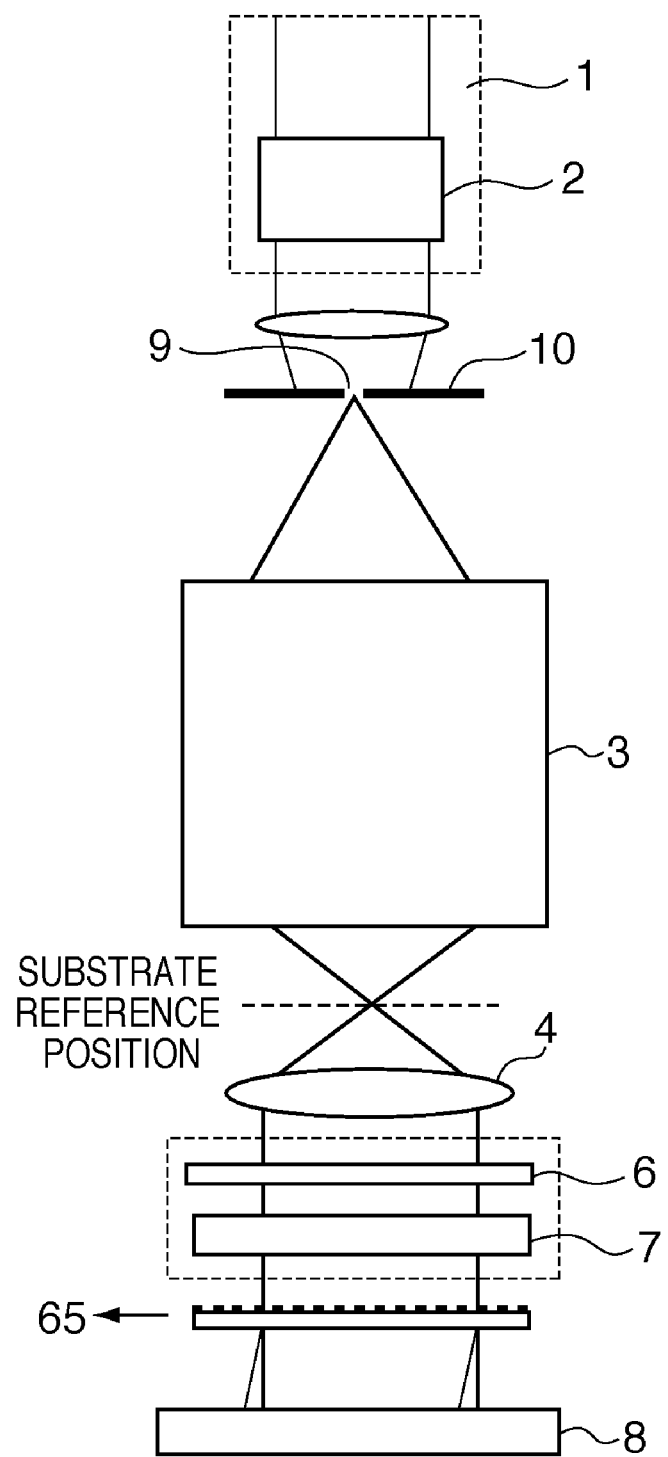
FIG. 6 is a view showing the schematic arrangement of the exposure apparatus incorporating the measurement apparatus of the second embodiment.

The detachable wavefront dividing unit 5 is not limited to the position shown in FIG. 5, but can be arranged at various positions. For example, as shown in FIG. 6, a diffraction grating 65 serving as a detachable wavefront dividing unit can be arranged at a position where light transmitted through a waveplate 6 and polarizer 7 reaches. Measurement using interference is performed with an arrangement in which the diffraction grating 65 is positioned in the optical path. Polarization measurement using intensity change is performed with an arrangement in which the diffraction grating 65 is removed from the optical path. Then, the optical characteristics of a projection optical system 3 are calculated from the two pieces of information.

Figure 7:
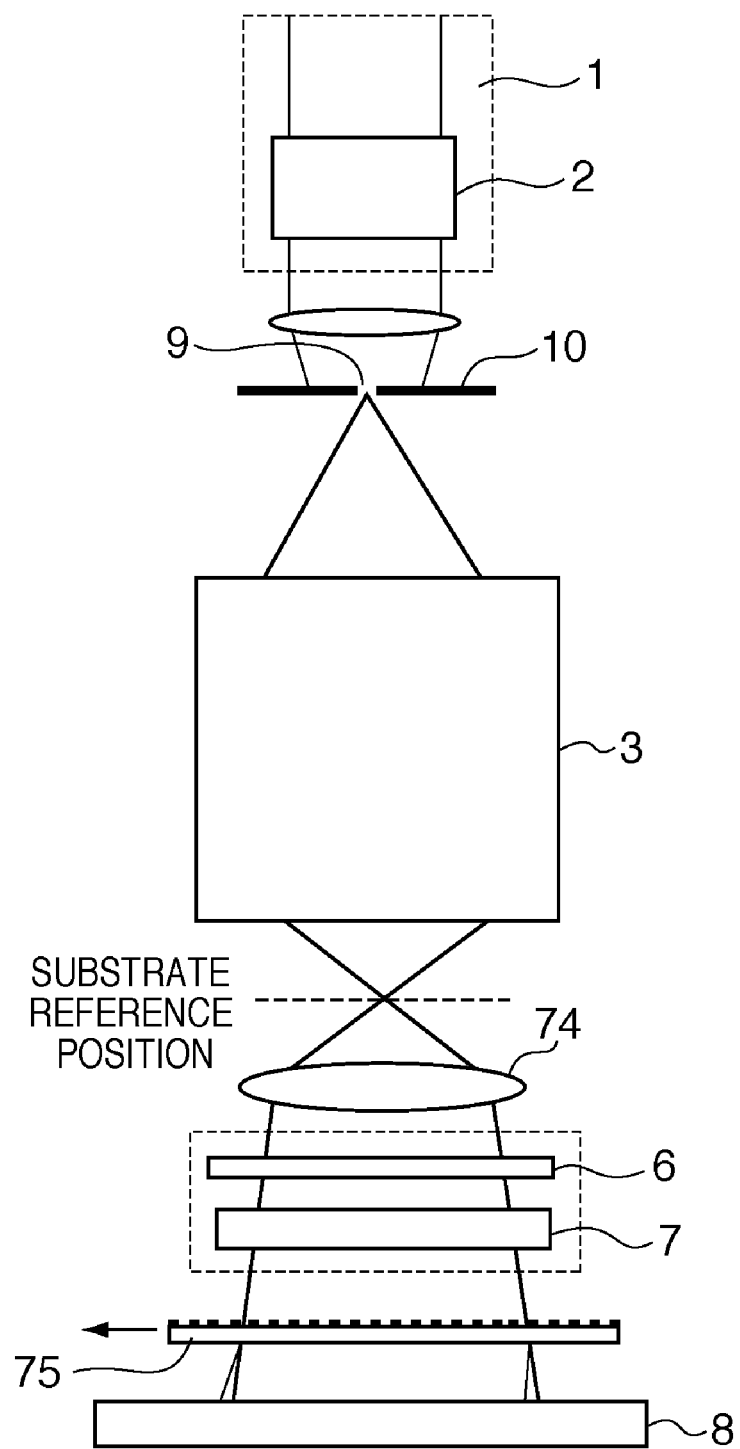
FIG. 7 is a view showing the schematic arrangement of the exposure apparatus incorporating the measurement apparatus of the second embodiment or those of the fifth embodiment.

For example, an arrangement as shown in FIG. 7 is possible, in which a lens 74 which reduces the numerical aperture to correspond to the allowable incident angle or less of the polarizing unit is arranged, and a diffraction grating 75 is arranged as a wavefront dividing unit. Measurement using interference is performed with an arrangement in which the diffraction grating 75 is positioned in the optical path. Polarization measurement using intensity change is performed with an arrangement in which the diffraction grating 75 is removed from the optical path. Then, the optical characteristics of a projection optical system 3 are calculated from the two pieces of information.

Figure 8:
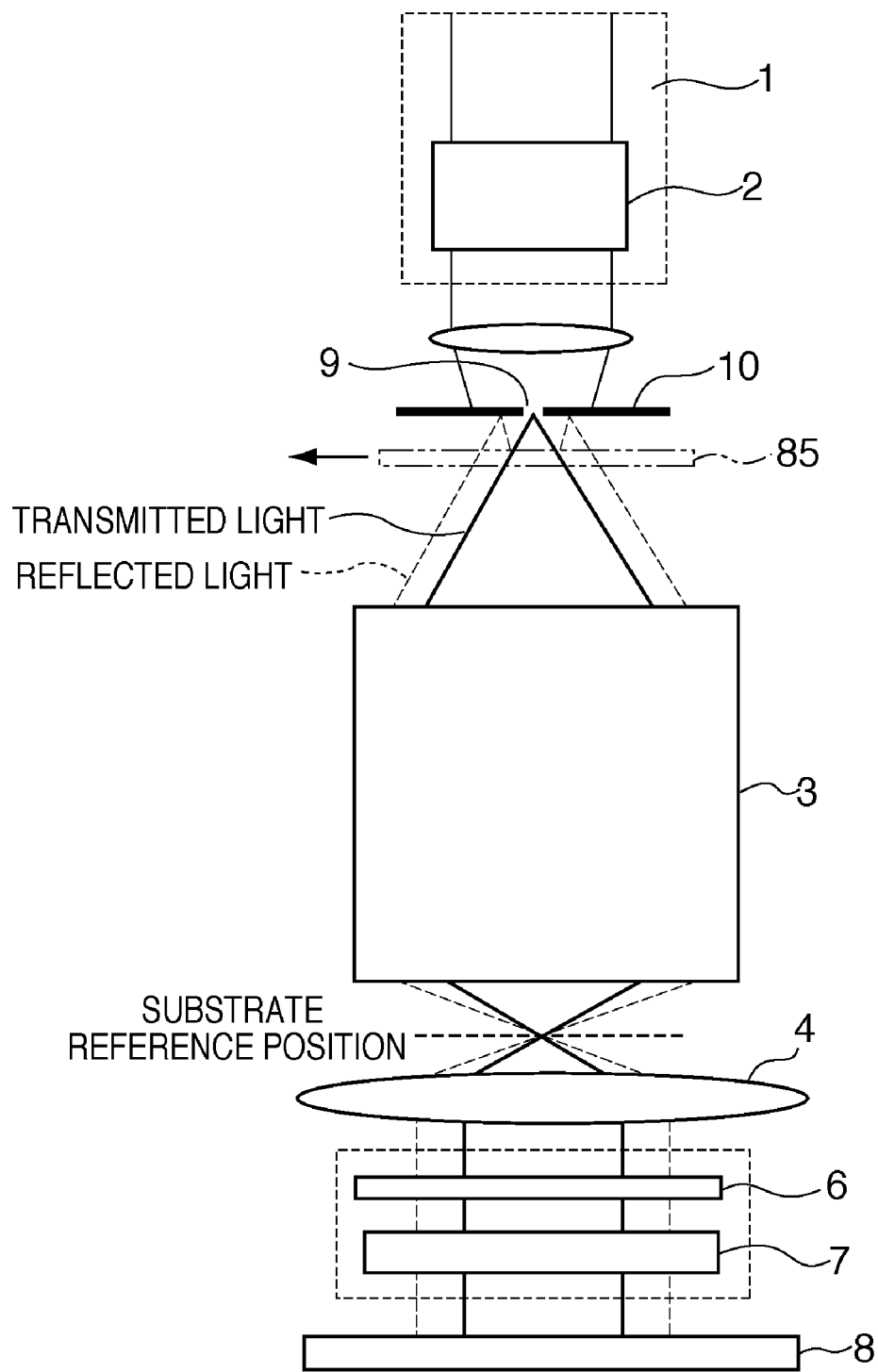
FIG. 8 is a view showing the schematic arrangement of the exposure apparatus incorporating the measurement apparatus of the second embodiment.

For example, an arrangement as shown in FIG. 8 is possible, in which a translucent reflecting substrate 85 serving as a detachable wavefront dividing unit is positioned between an illumination system 1 and projection optical system 3. A waveplate 6 and polarizer 7 which serve as a polarizing unit are positioned between the projection optical system 3 and a detector 8. The translucent reflecting substrate 85 may be positioned between a measuring reticle 10 having a pinhole 9 and the projection optical system 3, as shown in FIG. 8. An arrangement is also possible in which a diffraction grating is arranged on the side of the measuring reticle 10 and illumination system 1 and, for example, two pinholes are used as a measuring reticle. Measurement using interference is performed with an arrangement in which the diffraction grating is positioned in the optical path. Polarization measurement using intensity change is performed with an arrangement in which the diffraction grating is removed from the optical path. Then, the optical characteristics of the projection optical system are calculated from the two pieces of information.

FIG. 4 shows arrangement examples of the measuring reticle 10 and the detachable wavefront dividing unit employed in FIGS. 5 to 8. An arrangement (a) in FIG. 4 shows a case in which a pinhole is formed in the measuring reticle 10 and a two-dimensional diffraction grating is arranged as a detachable wavefront dividing unit. In this case, information on X- and Y-direction shear interference fringes can be obtained from one frame of interference fringes.

As other arrangements, for example, a two-dimensional diffraction grating as shown in FIG. 18A, in which light transmissive areas (white portions) and light-shielding areas (black portions) are arranged to form a checker board pattern, or a two-dimensional diffraction grating as shown in FIG. 18B, which has a pattern obtained by rotating the two-dimensional grating shown in FIG. 18A through 45°, can be used. The rotation angle need not be 45°. If the rotation angle is determined such that the direction along which the pixels of the CCDs line up is not identical with the direction along which the diffracted light components generated by the diffraction grating line up, error factors occurring in the pixels of the CCDs can be removed, and the wavefront can be calculated accurately.

FIGS. 18A and 18B show amplitude gratings. A phase grating can also be employed to which a phase difference of 180° is added by setting both the black portions and white portions in FIGS. 18A and 18B to serve as light transmissive areas. In this phase grating, theoretically, a 0th-order polarized light component disappears, and ±1st-order polarized light components become dominant, so that light can be utilized efficiently. A phase grating as shown in FIG. 18C, which has a two-dimensional array of light transmissive areas (white portions) in a light-shielding area (black portions), can also be used. As shown in FIG. 18C, the phases of the adjacent light transmissive areas are shifted from each other by 180° ($\pi$).

An arrangement (b) in FIG. 4 shows a case in which a pinhole is formed in the measuring reticle 10 and a one-dimensional diffraction grating is arranged as a detachable wavefront dividing unit. In this case, interference fringes sheared in the X direction are measured using one diffraction grating, and interference fringes sheared in the Y direction are measured using another diffraction grating which is perpendicular to the first diffraction grating. To obtain the shear interference fringes in two directions, two types of orthogonal diffraction gratings are exchanged. The one-dimensional diffraction grating can be an amplitude grating or phase grating, in the same manner as the two-dimensional grating.

An arrangement (c) in FIG. 4 shows a case in which the measuring reticle 10 has the same basic arrangement as that of the arrangement (b) in FIG. 4 but employs slits in order to improve the measurement accuracy by further increasing the light quantity. The slit directions are aligned with the directions of the one-dimensional diffraction gratings arranged as the detachable wavefront dividing unit. Hence, interference fringes sheared in the X direction are measured using the X-direction slit and one-dimensional diffraction grating, and interference fringes sheared in the Y direction are measured using the perpendicular Y-direction slit and one-dimensional diffraction grating. An arrangement (d) in FIG. 4 shows a case in which a pinhole is formed in the measuring reticle 10, and a translucent reflecting substrate is arranged as the detachable wavefront dividing unit. In this case, shear information in the radial direction can be obtained with one frame of interference fringes.

The detachable wavefront dividing unit 5 is not limited to the arrangements shown in FIGS. 4 to 8, but has various types of arrangements, for example, a diffraction grating (one-dimensional/two-dimensional), a parallel plate, a translucent reflecting substrate, a plurality of reflecting mirrors, a prism, or the like.

Third Embodiment

Figure 9:
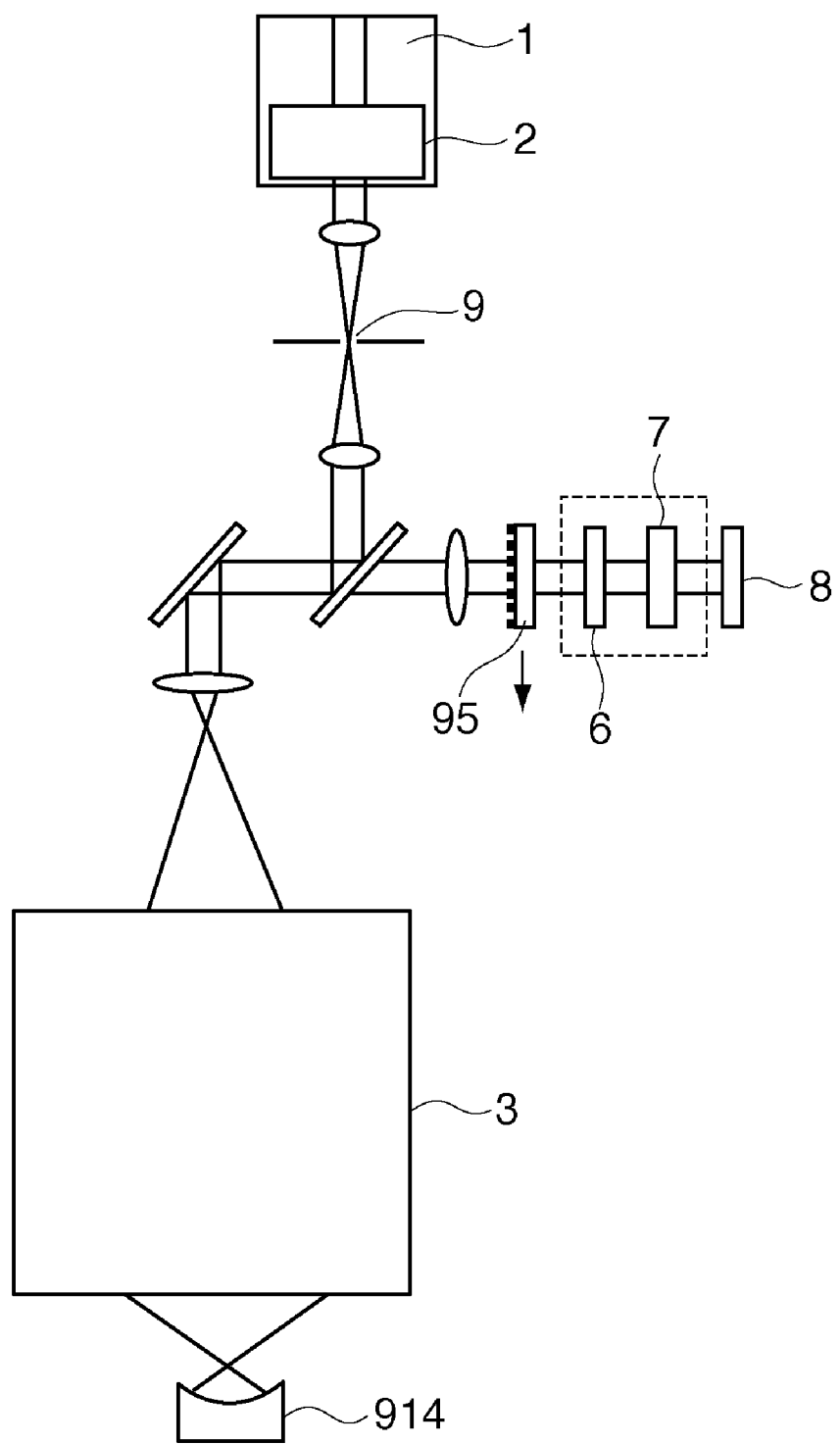
FIG. 9 is a view showing the schematic arrangement of an exposure apparatus incorporating a measurement apparatus of the third embodiment.

An exposure apparatus incorporating a measurement apparatus of the third embodiment of the present invention will be described with reference to FIG. 9. The measurement apparatus of the third embodiment comprises a detachable diffraction grating 95, waveplate 6, polarizer 7, and detector 8 on the original (reticle) side.

In the third embodiment, a reflecting mirror 914 reflects light transmitted through a projection optical system 3, and the detector 8 arranged on the original (reticle) side detects a wavefront transmitted through the projection optical system 3 again. When compared to measurement on the substrate side of the first and second embodiments, measurement of the third embodiment is advantageous in that, for example, since the light is transmitted through the projection optical system twice, the aberration amount is doubled, since the numerical aperture is small, the light can be collimated easily, the arranged has a degree of freedom. The third embodiment serves to measure the optical characteristics of the projection optical system 3 and comprises the diffraction grating 95 as the detachable wavefront dividing unit. The diffraction grating 95 can be inserted in or removed from the optical path. When the diffraction grating 95 is in the optical path, measurement using interference can be performed. When the diffraction grating 95 is not present in the optical path, polarization measurement using intensity change can be performed.

First, the diffraction grating 95 is inserted in the optical path, and measurement using interference is performed. Incident polarized light formed by a polarization controller 2 in an illumination system 1 forms an ideal wavefront as it is transmitted through a pinhole 9. When the ideal wavefront is transmitted through the projection optical system 3, it forms a wavefront having unpolarization aberration and polarization aberration. The ideal wavefront is reflected by the reflecting mirror 914 and transmitted through the projection optical system 3 again so that the aberration amount is doubled. As the accuracy increases, the aberration of the projection optical system decreases. As a further increase in detection accuracy is needed, the fact that the aberration amount can be detected by increasing it is a major advantage. The diffraction grating 95 inserted in the optical path to serve as a detachable wavefront dividing unit divides the wavefront with the increased aberration, and the divided wavefronts are transmitted through the waveplate 6 and polarizer 7 arranged at desired rotation angles. The detector 8 detects interference fringes formed by the overlaid wavefronts. A plurality of interference fringes are measured depending on the combinations of incident polarized light and the angles of the waveplate 6 and polarizer 7, and the differential wavefronts of unpolarization aberration and polarization aberration are calculated.

Subsequently, the diffraction grating 95 is removed from the optical path, and polarization measurement using intensity change is performed. Desired incident polarized light is formed, and the waveplate 6 is rotated a plurality of number of times to detect intensity change. From this measurement, polarization aberration data on at least one point within the measurement region is calculated, and is determined as reference birefringence data. Unpolarization aberration and polarization aberration as the optical characteristics of the projection optical system 3 can be calculated from the differential wavefront obtained by interference measurement and the reference birefringence data obtained by intensity polarization measurement. The pattern of the measuring reticle to form the ideal wavefront and the detachable wavefront dividing unit can have various types of arrangements, as shown in, for example, FIG. 4.

To measure the aberration of the projection optical system 3 accurately, the aberration of the projection optical system 3 needs to be separated from the aberration of the system such as an optical component employed as the collimator. To measure the system aberration, a reflecting mirror is arranged before the projection optical system 3, and measurement using interference and polarization measurement using intensity change of light which is not transmitted through the projection optical system 3 are performed in the same manner as described above. More specifically, assume a case in which the reflecting mirror is arranged to reflect light before the light is transmitted through the projection optical system 3, and a case in which the reflecting mirror is arranged to reflect light after the light is transmitted through the projection optical system 3. In both cases, the diffraction grating 95 as the detachable wavefront dividing unit is inserted in the optical path, and interference is measured. Also, the diffraction grating 95 is removed from the optical path, and polarization using intensity change is measured. The system aberration, measured with the arrangement in which the reflecting mirror is arranged before the projection optical system to reflect the light before the light is transmitted through the projection optical system 3, is subtracted with the aberration measured with the arrangement in which the reflecting mirror is arranged to reflect the light after the light is transmitted through the projection optical system 3, so that the aberration of the projection optical system can be grasped accurately.

Figure 10:
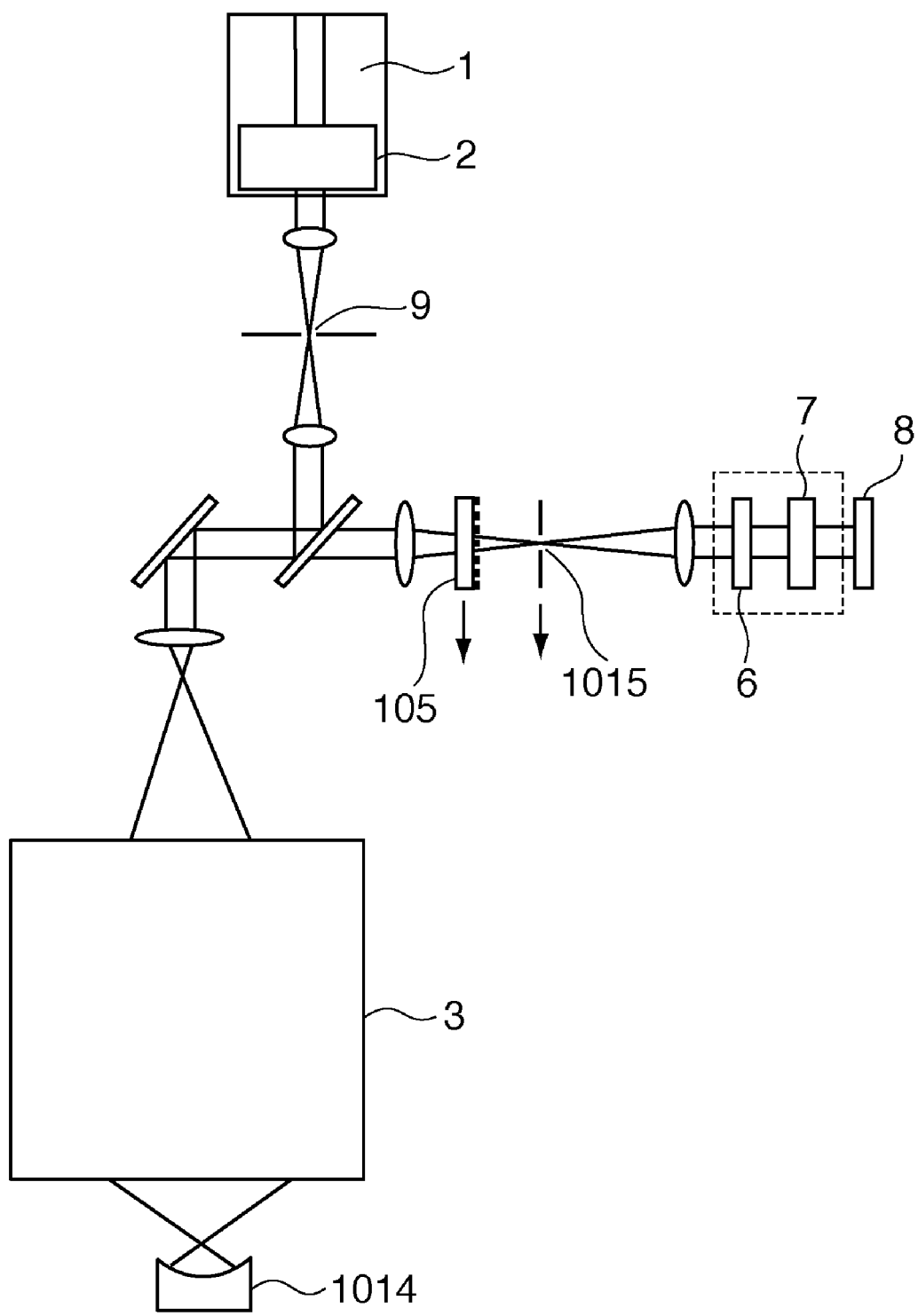
FIG. 10 is a view showing the schematic arrangement of the exposure apparatus incorporating the measurement apparatus of the third embodiment.

The arrangement in which the wavefront dividing unit is arranged on the original (reticle) side includes various types of examples. For example, as shown in FIG. 10, the light may be focused once on the original (reticle) side as well, a diffraction grating 105 may be arranged as a detachable wavefront dividing unit before the focal point, and a selecting window 1015 may be arranged at the focal point. The selecting window 1015 selects, of wavefronts diffracted by the diffraction grating, only those of orders necessary for measurement. For example, a window that extracts only ±1st-order polarized light components is arranged. In this case, intense 0th-order polarized light components can be removed, and only the polarized light components of diffraction orders necessary for measurement can be selected. Therefore, the arrangement of FIG. 10 can perform measurement more accurately than the arrangement of FIG. 9.

The selecting window is used only when a diffraction grating is arranged, and is unnecessary for measurement of intensity. Hence, when a diffraction grating serving as a wavefront dividing unit is positioned in the optical path, the selecting window is also positioned in the optical path. When the intensity is to be measured by removing the wavefront dividing unit from the optical path, the selecting window must also be removed from the optical path simultaneously.

Figure 13:
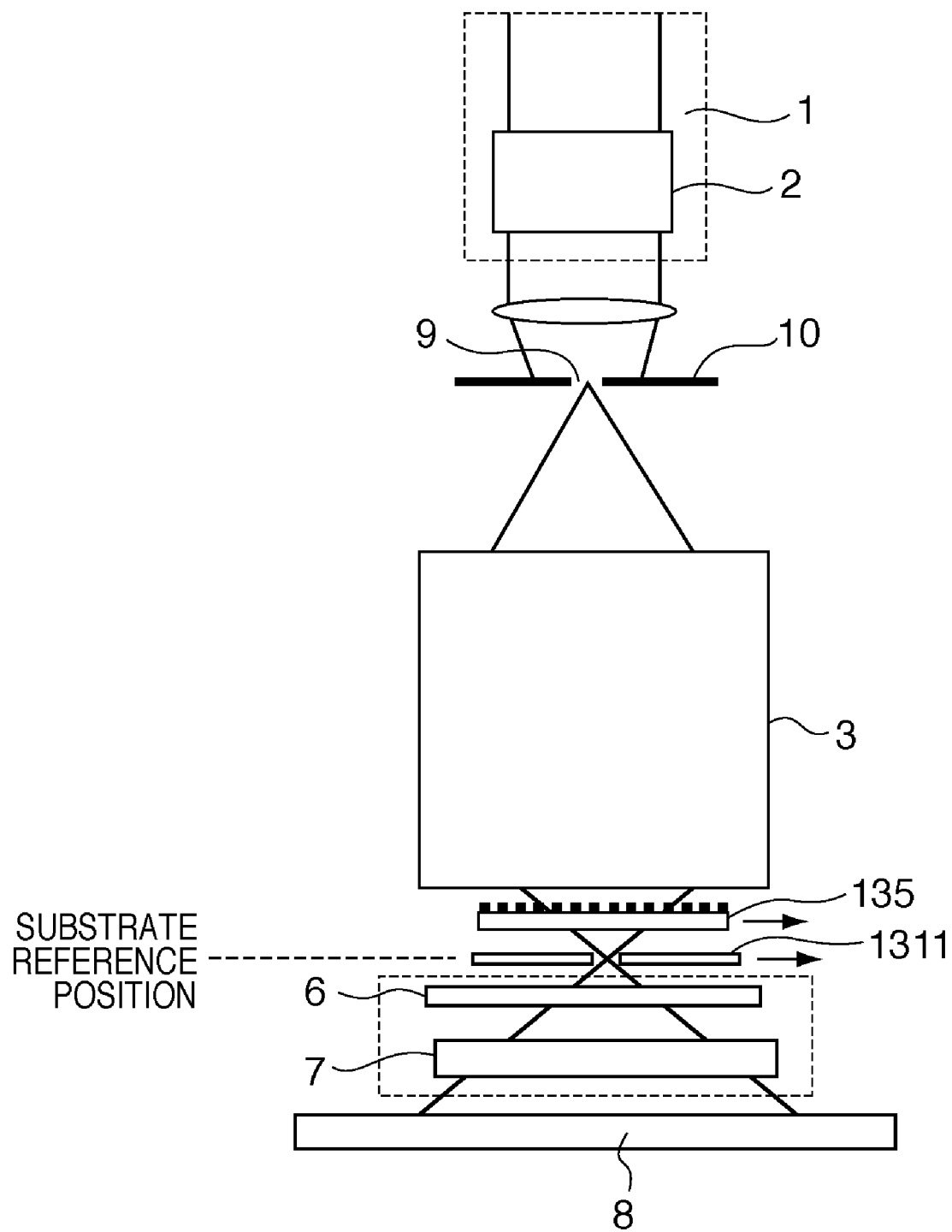
FIG. 13 is a view showing the schematic arrangement of the exposure apparatus incorporating the measurement apparatus of the fifth embodiment.

Furthermore, in a case as shown in FIG. 8 in which a translucent substrate is positioned between an illumination system and projection optical system, a reflecting mirror may be arranged on the original (reticle) side to reflect light, and the reflected light may be received on the original (reticle) side, as a matter of course. Furthermore, in a case as shown in FIG. 13 as well in which a diffraction grating is positioned between an illumination system and projection optical system, a reflecting mirror may be arranged on the original (reticle) side to reflect light, and the reflected light may be received on the original (reticle) side, as a matter of course.

Fourth Embodiment

Figure 3:
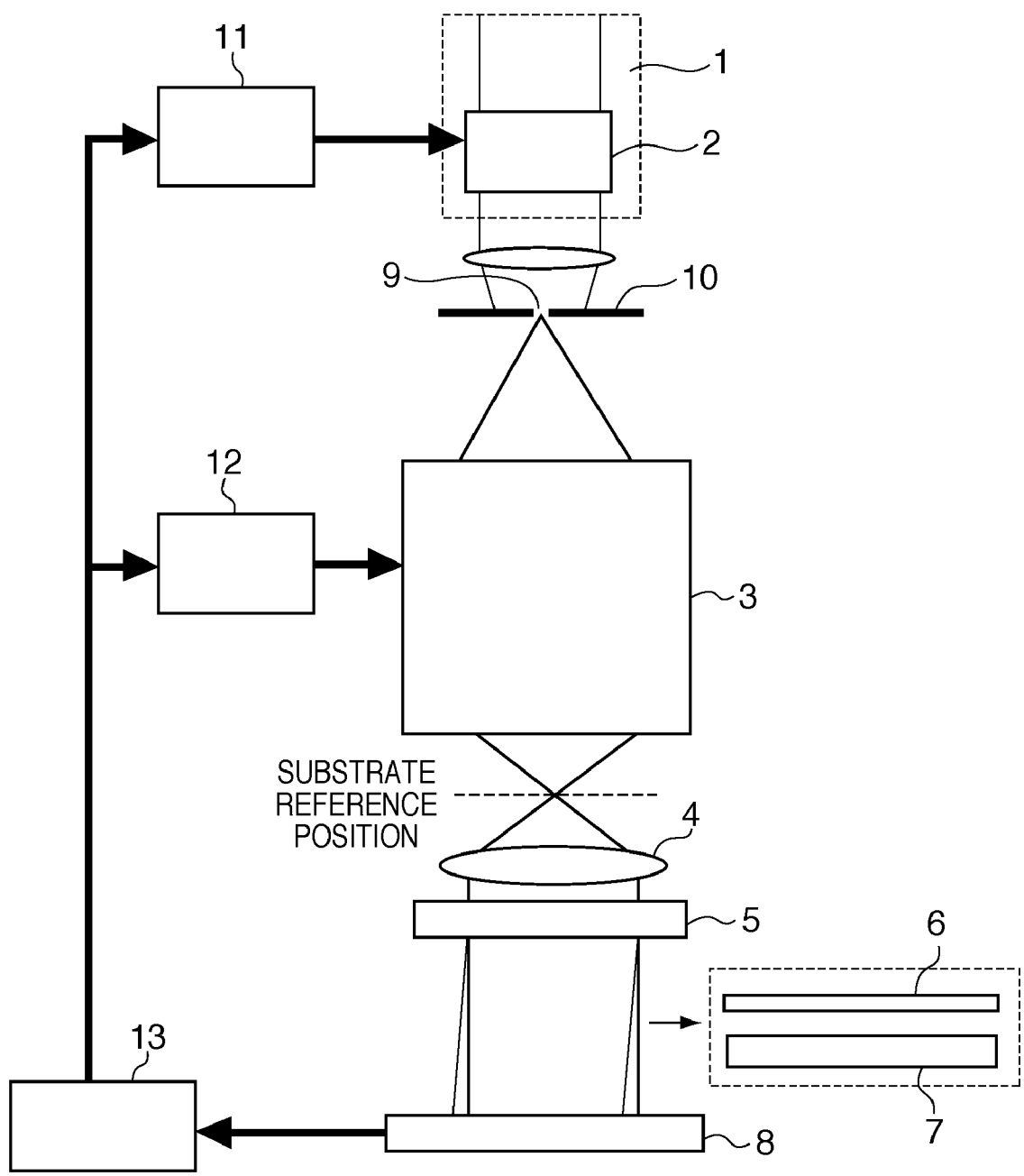
FIG. 3 is a view showing the schematic arrangement of the exposure apparatus incorporating the measurement apparatus of the fourth embodiment.

An exposure apparatus incorporating a measurement apparatus of the fourth embodiment of the present invention will be described with reference to FIGS. 2 and 3. The measurement apparatus of the fourth embodiment comprises a detachable wavefront dividing unit 5 and a detachable polarizing unit on the substrate side. This embodiment can provide an exposure apparatus that can cope with not only collimated parallel light but also a divergent beam. Although an adjustment mechanism is not shown, a mechanism that adjusts to an optimum state based on the measurement result may naturally be provided.

Although the arrangement of the fourth embodiment is partly similar to that of the first embodiment, its characteristic feature resides in that a wavefront dividing unit 5 and a polarizing unit as a combination of a waveplate 6 and polarizer 7 are both detachable, and can be moved with respect to a detector 8, so that they can be positioned in or outside the optical path. This embodiment comprises the second driving unit (not shown) which moves the polarizing unit with respect to the detector 8. Also, the wavefront dividing unit 5 and the polarizing unit are arranged in a specific manner. In measurement with an interferometer, as shown in FIG. 3, only the wavefront dividing unit 5 is positioned in the optical path, and the polarizing units 6 and 7 are removed from the optical path. In intensity polarization measurement, as shown in FIG. 2, the wavefront dividing unit 5 is removed from the optical path, and only the polarizing units 6 and 7 are positioned in the optical path.

This will be described hereinafter in more detail. For interference measurement, only the wavefront dividing unit 5 is inserted in the optical path, and the polarizing units 6 and 7 are removed from the optical path, as shown in FIG. 3. Incident polarized light formed by a polarization controller 2 in an illumination system 1 forms an ideal wavefront as it is transmitted through a pinhole 9. When the ideal wavefront is transmitted through a projection optical system 3, it forms a wavefront having unpolarization aberration and polarization aberration. The wavefront dividing unit 5 divides the wavefront with aberration, and the detector 8 measures the interference fringes formed by overlaid wavefronts. As the polarizing units 6 and 7 do not exist, a plurality (at least three) of interference fringes obtained by changing incident polarized light are measured, and the differential wavefronts of unpolarization aberration and polarization aberration are calculated.

When performing polarization measurement using intensity change, the wavefront dividing unit 5 is removed from the optical path, and only the polarizing units 6 and 7 are positioned in the optical path, as shown in FIG. 2. Desired incident polarized light is formed, and the waveplate 6 is rotated a plurality of number of times to measure intensity change. Polarization aberration information on at least one point within the measurement region is calculated by this measurement, and is determined as reference birefringence data. Unpolarization aberration and polarization aberration as the optical characteristics of the projection optical system 3 are calculated from the differential wavefront obtained by interference measurement and the reference birefringence data obtained by polarization measurement using intensity change.

Fifth Embodiment

An exposure apparatus incorporating a measurement apparatus of the fifth embodiment will be described with reference to FIG. 13. The measurement apparatus of the fifth embodiment is an example in which the fourth embodiment is applied to a divergent beam (a beam having a numerical aperture). For example, when the beam diverges as shown in FIG. 13, a diffraction grating 135 may be arranged as a detachable wavefront dividing unit. FIG. 13 shows an example in which the diffraction grating 135 is arranged before the substrate reference position and a selecting window 1311 capable of selecting only light with a diffraction order necessary for wavefront recovery is arranged at the substrate reference position.

A polarizing unit such as a waveplate 6 or polarizer 7 has incident angle characteristics, and is accordingly preferably employed for parallel light. In the arrangement shown in FIG. 13, as no collimator lens is present, the beam diverges in accordance with the numerical aperture of a projection optical system 3. With such a divergent beam, a polarizing unit cannot be used. Hence, when performing interference measurement, the diffraction grating 135 as the detachable wavefront dividing unit and the selecting window 1311 are positioned in the optical path, in the same manner as in the arrangement shown in FIG. 3, and the waveplate 6 and polarizer 7 are removed from the optical path.

Incident polarized light formed by a polarization controller 2 in an illumination system 1 forms an ideal wavefront as it is transmitted through a pinhole 9. When the ideal wavefront is transmitted through the projection optical system 3, it forms a wavefront having unpolarization aberration and polarization aberration. The diffraction grating 135 divides the wavefront with aberration. The selecting window 1311 transmits only ±1st-order polarized light components necessary for interference measurement, and a detector 8 measures interference fringes formed by overlaid wavefronts. By removing the polarizing unit from the optical path, the interference fringes can be measured on the entire surface of the measurement region. A plurality (at least three) of interference fringes obtained by changing incident polarized light are measured, and the differential wavefronts of unpolarization aberration and polarization aberration on the entire surface of the measurement region are calculated.

As described above, since only differential wavefronts (differential aberration information) can be obtained with interference measurement, reference birefringence data as the polarization aberration of at least one point within at least the measurement region is necessary. Hence, when performing intensity polarization measurement, the diffraction grating 135 arranged as the wavefront dividing unit 5 and the selecting window 1311 are removed from the optical path, and the polarizing units 6 and 7 are positioned in the optical path, in the same manner as in the arrangement shown in FIG. 2.

Even if the beam diverges as in FIG. 13, the near-center portion of the beam forms parallel light. Hence, at only the near-center portion of the beam, measurement using the polarizing units 6 and 7 is also possible. Polarization measurement using intensity change need not be performed on the entire surface of the measurement region, and it suffices as far as information on at least one point within the measurement region is obtained. Therefore, it suffices if only the near-center portion of the beam where the beam forms almost parallel light can be measured.

In this manner, if the differential wavefront on the entire surface of the measurement region which is obtained by interference measurement, and birefringence data of the near-center portion which is obtained by intensity polarization measurement are used as the reference birefringence data, unpolarization aberration and polarization aberration as the optical characteristics of the projection optical system 3 can be calculated accurately.

According to this embodiment, since no collimator lens is necessary, the arrangement is simple. Since separation from collimator lens aberration is also unnecessary, an accurate, simpler measurement method can be provided.

Figure 14:
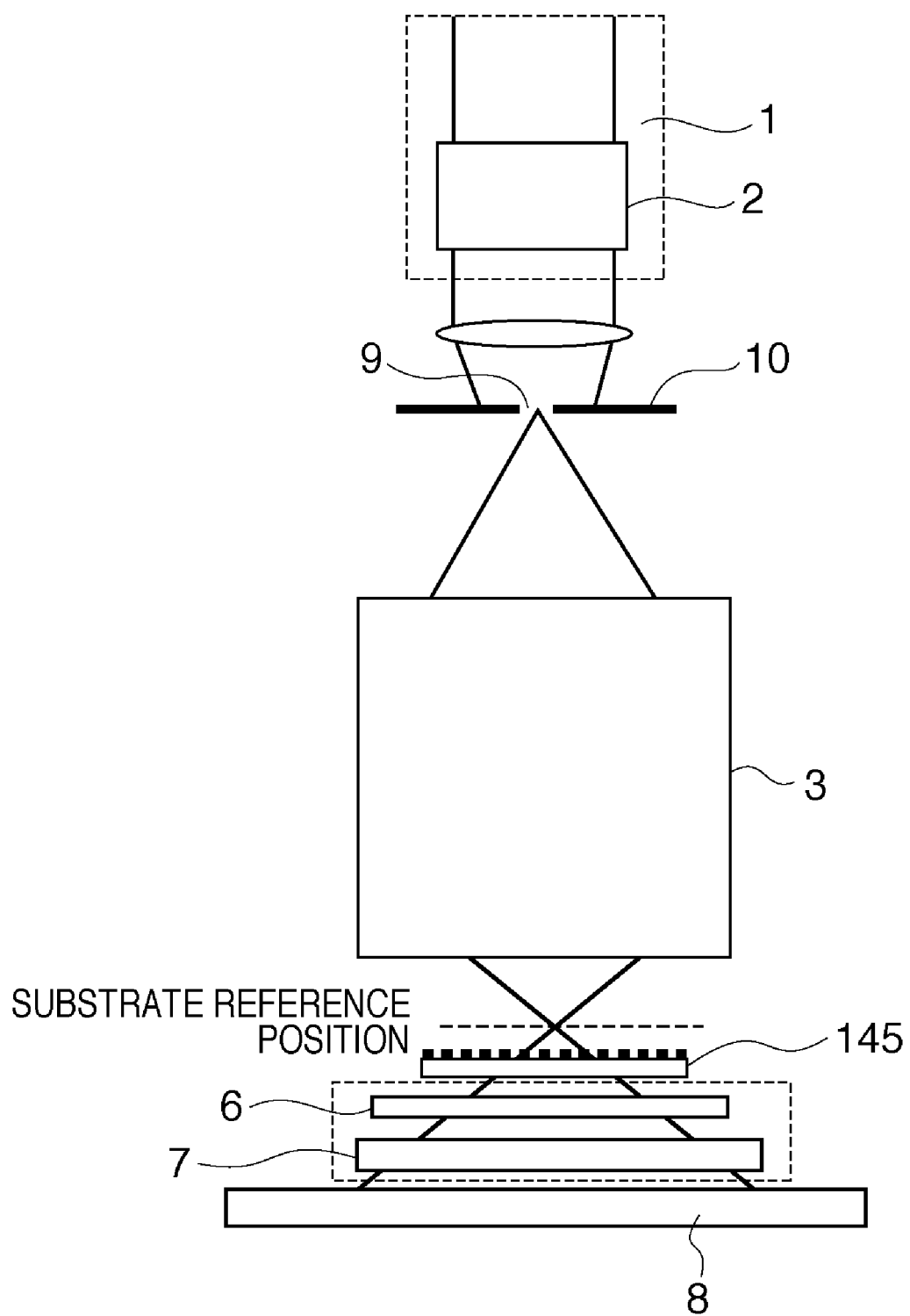
FIG. 14 is a view showing the schematic arrangement of the exposure apparatus incorporating the measurement apparatus of the fifth embodiment.

The detachable wavefront dividing unit is not limited to the position shown in FIG. 5, but can be arranged at various different positions. For example, the same measurement can be performed with an arrangement in which a diffraction grating 145 as a detachable wavefront dividing unit is arranged under the substrate reference position, as shown in FIG. 14. In this case, no selecting window can be arranged. Interference is measured with an arrangement in which the diffraction grating 145 is positioned in the optical path and polarizing units 6 and 7 are removed from the optical path. Intensity polarization is measured with an arrangement in which the diffraction grating 145 is removed from the optical path and the polarizing units 6 and 7 are inserted in the optical path. Then, the optical characteristics of the projection optical system 3 are calculated from the two pieces of data.

For example, the same measurement can be performed with an arrangement in which a diffraction grating 155 as a detachable wavefront dividing unit is arranged before the projection optical system 3, as shown in FIG. 15. Interference is measured with an arrangement in which the diffraction grating 155 is positioned in the optical path and the polarizing units 6 and 7 are removed from the optical path. Intensity polarization is measured with an arrangement in which the diffraction grating 155 is removed from the optical path and the polarizing units 6 and 7 are inserted in the optical path. Then, the optical characteristics of the projection optical system 3 are calculated from the two pieces of data.

For example, an arrangement as shown in FIG. 7 is possible, in which the lens 74 which reduces the numerical aperture is arranged and the diffraction grating 75 is arranged as a wavefront dividing unit. In the second embodiment, the numerical aperture is reduced to correspond to the incident angle allowable range of the polarizing unit. In the fifth embodiment, measurement is possible even when the numerical aperture reducing lens 174 reduces the numerical aperture to preferably about NA=0.6.

As the accuracy increases, the numerical aperture of the projection optical system increases. If the numerical aperture is excessively large, interference fringes may not be obtained on the entire surface of the measurement region. Hence, it suffices if the numerical aperture is reduced to such a degree that interference fringes can be obtained on the entire surface of the measurement region. It is known that if the numerical aperture is set to NA=0.6 or less, interference fringes that can be measured well can be obtained on the entire surface of the measurement region, as described in Japanese Patent Laid-Open No. 2006-228930 (U.S. Patent Publication No. 2006/0187435) by the present inventor.

If the numerical aperture needs to be reduced to only about NA=0.6 rather than until complete parallel light is obtained or until the numerical aperture corresponds to the allowable incident angle of the polarizing unit, the lens arrangement becomes very simple, and the apparatus arrangement becomes simple.

Interference is measured with an arrangement in which the diffraction grating 75 is positioned in the optical path and the polarizing units 6 and 7 are removed from the optical path. Polarization measurement using intensity change is performed with an arrangement in which the diffraction grating 75 is removed from the optical path and the polarizing units 6 and 7 are inserted in the optical path. Then, the optical characteristics of the projection optical system 3 are calculated from the two pieces of data.

FIG. 4 shows arrangement examples of the measuring reticle 10 and detachable wavefront dividing units 75, 135, 145, and 155 employed in FIGS. 7, 13, 14, and 15. The detachable wavefront dividing unit is not limited to the arrangements shown in FIG. 4, but can have various arrangements, for example, a diffraction grating (one-dimensional/two-dimensional), a parallel plate, a translucent reflecting substrate, a plurality of reflecting mirrors, a prism, and the like. As the diffraction grating, an amplitude grating and phase grating can be used. For example, the diffraction gratings shown in FIGS. 18A to 18C can be used.

The same measurement can be performed with an arrangement in which the diffraction grating 155 as the detachable wavefront dividing unit is arranged before the projection optical system. Measurement using interference is performed with an arrangement in which the diffraction grating 155 is positioned in the optical path and the polarizing units 6 and 7 are removed from the optical path. Polarization measurement using intensity change is performed with an arrangement in which the diffraction grating 155 is removed from the optical path and the polarizing units 6 and 7 are inserted in the optical path. The optical characteristics of the projection optical system 3 are calculated from the two pieces of data.

An arrangement is also possible in which the diffraction grating 65 as the detachable wavefront dividing unit is arranged at a position where light transmitted through the waveplate 6 and polarizer 7 reaches. Measurement using interference is performed with an arrangement in which a diffraction grating is positioned in the optical path. Polarization measurement using intensity change is performed with an arrangement in which the diffraction grating is removed from the optical path. The optical characteristics of the projection optical system 3 are calculated from the two pieces of data.

Sixth Embodiment

An exposure apparatus incorporating a measurement apparatus of the sixth embodiment of the present invention will be described with reference to FIG. 12. The sixth embodiment is an example in which the present invention is applied to measurement of the optical characteristics of an illumination system. This embodiment can be used as a measurement sensor which checks whether or not a beam entering a projection optical system is in a polarized state, and for measurement of the unpolarization aberration and polarization aberration of the illumination system during exposure as well.

Figure 12:
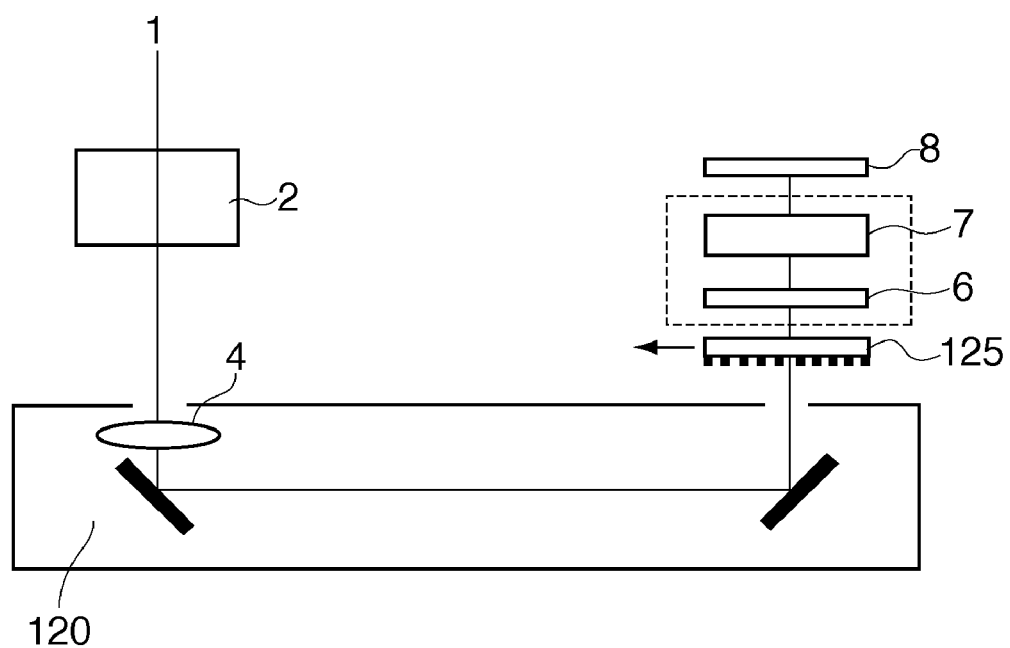
FIG. 12 is a view showing the schematic arrangement of an exposure apparatus incorporating a measurement apparatus of the sixth embodiment.

FIG. 12 shows an example constituted to include an illumination light measuring reticle. Generally, the reticle has a thickness of about 6 mm, and a pellicle is present at a position about 6 mm under the lower surface of the measuring reticle 10, providing a total thickness of about 12 mm. If a lens and mirror are arranged to be contained within the range of 12 mm, the polarization state of the light entering a projection optical system 3 can be measured at a position on the original (reticle) side without moving the projection optical system 3. The lens transforms the illumination light into parallel light, and the combination of the mirror, a diffraction grating 125 as a detachable wavefront dividing unit, a waveplate 6, a polarizer 7, and a detector 8 performs measurement.

The diffraction grating 125 arranged as the detachable wavefront dividing unit can be inserted in and removed from the optical path. When the diffraction grating 125 is located in the optical path, measurement using interference can be performed. When the diffraction grating is not located on the optical path, polarization measurement using intensity change can be performed.

First, the diffraction grating 125 is inserted in the optical path, and measurement using interference is performed. Incident polarized light formed by a polarization controller 2 arranged in an illumination system 1 is transformed into parallel light using the mirror and lens, is wavefront-divided by the diffraction grating 125 serving as the wavefront dividing unit, and is transmitted through the waveplate 6 and polarizer 7 arranged at desired rotation angles. The detector 8 detects interference fringes formed by overlaid wavefronts. A plurality of interference fringes are measured in the combinations of incident polarized light and the rotation angles of the waveplate and polarizer, and the differential wavefronts of unpolarization aberration and polarization aberration are calculated.

Subsequently, the diffraction grating 125 is removed from the optical path, and polarization measurement using intensity change is performed. Desired incident polarized light is formed, and the waveplate 6 is rotated a plurality of number of times to measure intensity change. From this measurement, polarization aberration data on at least one point within the measurement region is calculated, and is determined as reference birefringence data. Unpolarization aberration and polarization aberration as the optical characteristics of the illumination system 1 can be calculated from the differential wavefront obtained by interference measurement and the reference birefringence data obtained by intensity polarization measurement.

As described in the fourth embodiment, when performing measurement using interference, only the diffraction grating 125 may be positioned in the optical path, and the polarizing units 6 and 7 may be removed from the optical path. When performing polarization measurement using intensity change, the diffraction grating 125 may be removed from the optical path, and the polarizing units 6 and 7 may be positioned in the optical path.

When only polarization aberration is needed, measurement can be performed with an arrangement in which only the waveplate 6 and polarizer 7 are arranged, as shown in FIG. 11. Although an adjustment mechanism is not shown, a mechanism that performs adjustment to an optimum state based on the measurement result may be included, as a matter of course.

This embodiment enables measurement of not only the optical characteristics of the projection optical system 3 but also the optical characteristics of the illumination system 1 separately and accurately, thus enabling more accurate measurement. If the characteristics of the projection optical system 3 and illumination system 1 can be measured separately, various different applications become possible. For example, when the illumination system is changed, the characteristics of only the illumination system need to be measured. The optical characteristics of the illumination system and projection system can be applied to simulation. Hence, more accurate measurement and reduction of the measurement time also become possible.

Seventh Embodiment

A measurement apparatus of the seventh embodiment of the present invention will be described with reference to FIG. 16. The seventh embodiment provides a measurement apparatus which measures the optical characteristics of a detection target. The characteristic feature of this embodiment resides in that a detachable wavefront dividing unit is arranged, as described above.

First, the detachable wavefront dividing unit is inserted in the optical path, and measurement using interference is performed. As incident polarized light formed by a polarization controller is transmitted through a detection target, it changes to a wavefront having the optical characteristics of the detection target. After the detachable wavefront dividing unit divides the wavefront, the divisional wavefronts are transmitted through a waveplate and polarizer arranged at desired rotation angles. A detector detects interference fringes formed by overlaid wavefronts. A plurality of interference fringes are measured in the combinations of incident polarized light and the rotation angles of the waveplate and polarizer, and the differential wavefronts of unpolarization aberration and polarization aberration are calculated.

Subsequently, the detachable wavefront dividing unit is removed from the optical path, and polarization measurement using intensity change is performed. Desired incident polarized light is formed, and the waveplate is rotated a plurality of number of times to measure intensity change. From this measurement, polarization aberration data on at least one point within the measurement region is calculated, and is determined as reference birefringence data.

Unpolarization aberration and polarization aberration as the optical characteristics of the detection target are calculated from the differential wavefront obtained by measurement using interference and the reference birefringence data obtained by polarization measurement using intensity change.

Figure 16:
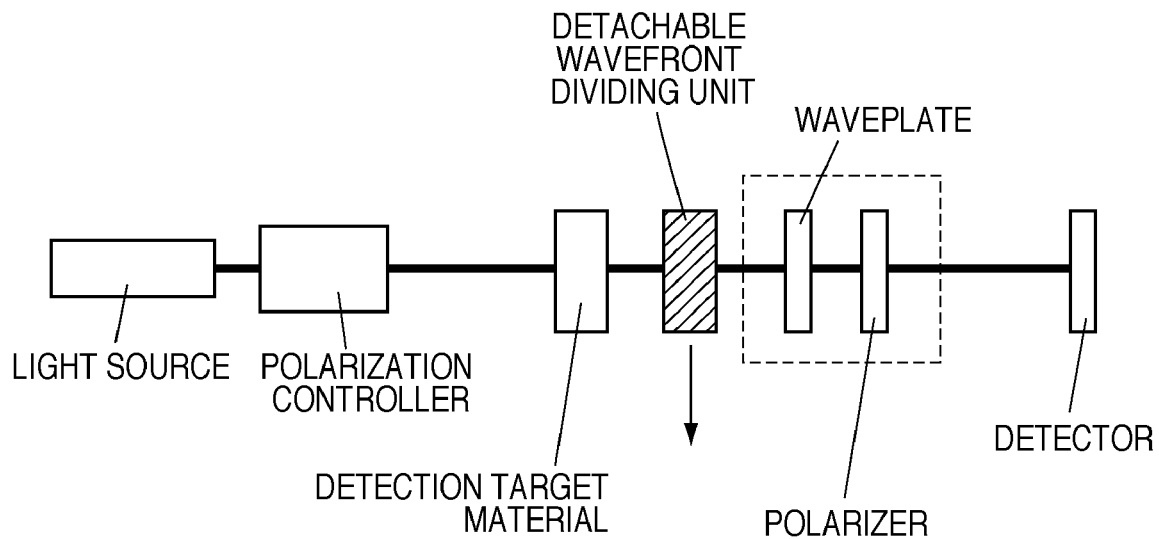
FIG. 16 is a view showing the schematic arrangement of a measurement apparatus of the seventh embodiment.

The detachable wavefront dividing unit is not limited to the position shown in FIG. 16, but may be arranged after the waveplate and polarizer, or before the detection target. As in the fourth embodiment, when performing measurement using interference, only the wavefront dividing unit may be positioned in the optical path. When performing polarization measurement using intensity change, only the polarizing unit (waveplate and polarizer) may be positioned in the optical path. The scheme of performing polarization measurement using intensity change is not limited to rotation of the waveplate. Measurement can be performed with various types of combinations of incident polarized light, rotation of the waveplate, and rotation of the polarizer.

The detection target is not limited to the illumination system or projection optical system used in the exposure apparatus, but may be another optical element or optical system such as a lens.

[Embodiment of Device Manufacture]

An example of a device manufacturing method utilizing the exposure apparatus described above will be explained.

A device (a semiconductor integrated circuit element, a liquid crystal display element, or the like) is manufactured by an exposure step of exposing a substrate using the exposure apparatus of one of the embodiments described above, a developing step of developing the substrate exposed in the exposure step, and other known steps (etching, resist removal, dicing, bonding, packaging, and the like) of processing the substrate developed in the developing step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-166769, filed Jun. 25, 2007 which is hereby incorporated by reference herein in its entirety.

What is claimed is:

1. A measurement apparatus for measuring optical characteristics of a detection target, the measurement apparatus comprising:
   a polarization controller which controls polarization of light which is incident on the detection target;
   a wavefront dividing unit which divides a wavefront of the light from the polarization controller;
   a polarizing unit which polarizes the light transmitted through the detection target;
   a detector which detects the light transmitted through at least one of said wavefront dividing unit and said polarizing unit;
   a processor which calculates the optical characteristics of the detection target based on a detection result of said detector; and
   a first driving unit which moves said wavefront dividing unit with respect to said detector to position said wavefront dividing unit in or outside an optical path running from the detection target to said detector;
   a second driving unit which moves said polarizing unit with respect to said detector to position said polarizing unit in or outside the optical path, and
   a control unit which controls said first driving unit and said second driving unit so that said second driving unit positions said polarizing unit outside the optical path when said first driving unit positions said wavefront dividing unit in the optical path, and that said second driving unit positions said polarizing unit in the optical path when said first driving unit positions said wavefront dividing unit outside the optical path,
   wherein said processor calculates the optical characteristics of the detection target using a detection result obtained when said wavefront dividing unit is positioned in the optical path and a detection result obtained when said wavefront dividing unit is positioned outside the optical path.

2. The apparatus according to claim 1,
wherein said polarizing unit includes a rotatable element,
said detector detects interference fringes when said wavefront dividing unit is positioned in the optical path, and a change in light intensity distribution caused by rotation of at least one element of said polarizing unit when said wavefront dividing unit is positioned outside the optical path, and
said processor calculates differential data of aberration caused by the detection target based on the detected interference fringes, and data on birefringence of the detection target based on the detected change in light intensity distribution.

3. The apparatus according to claim 1,
wherein said wavefront dividing unit includes a diffraction grating,
the apparatus further comprises a selecting window which selects only a wavefront with a predetermined order among wavefronts diffracted by said diffraction grating, and
said selecting window is positioned in or outside the optical path simultaneously with said wavefront dividing unit.

4. An exposure apparatus comprising an illumination system which illuminates an original, a projection optical system which projects a pattern of the original illuminated by said illumination system onto a substrate, and the measurement apparatus defined in claim 1,
   wherein the detection target comprises said projection optical system,
   said polarization controller is positioned in said illumination system, and
   said wavefront dividing unit and said polarizing unit are positioned between said projection optical system and said detector.

5. An exposure apparatus comprising an illumination system which illuminates an original, a projection optical system which projects a pattern of the original illuminated by said illumination system onto a substrate, and the measurement apparatus defined in claim 1, wherein the detection target comprises said projection optical system, said polarization controller is positioned in said illumination system, said wavefront dividing unit is positioned between said illumination system and said projection optical system, and said polarizing unit is positioned between said projection optical system and said detector.

6. An apparatus according to claim 4, further comprising a reflecting mirror which reflects the light transmitted through said projection optical system, wherein said detectoSr is positioned to detect the light reflected by said reflecting mirror and transmitted again through said projection optical system.

7. An apparatus according to claim 5, further comprising a reflecting mirror which reflects the light transmitted through said projection optical system, wherein said detector is positioned to detect the light reflected by said reflecting mirror and transmitted again through said projection optical system.

8. An exposure apparatus according to claim 4, further comprising a control unit which controls at least one of said illumination system and said projection optical system based on a result calculated by said processor.

9. A method of manufacturing a device, the method comprising:

exposing a substrate using an exposure apparatus defined in claim 4;

developing the exposed substrate; and processing the developed substrate to manufacture the device.

\* \* \* \* \*